US009041492B2

(12) United States Patent
Wang et al.

(10) Patent No.: US 9,041,492 B2
(45) Date of Patent: May 26, 2015

(54) UNRELEASED MEMS RESONATOR AND METHOD OF FORMING SAME

(75) Inventors: Wentao Wang, Cambridge, MA (US); Dana Weinstein, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 298 days.

(21) Appl. No.: 13/460,670

(22) Filed: Apr. 30, 2012

(65) Prior Publication Data

US 2013/0033338 A1    Feb. 7, 2013

Related U.S. Application Data

(60) Provisional application No. 61/480,815, filed on Apr. 29, 2011.

(51) Int. Cl.
*H03H 3/02* (2006.01)
*H03H 9/17* (2006.01)
*H03H 3/007* (2006.01)
*H03H 9/24* (2006.01)

(52) U.S. Cl.
CPC ............ *H03H 9/175* (2013.01); *H03H 3/0072* (2013.01); *H03H 9/2405* (2013.01); *H03H 2009/241* (2013.01)

(58) Field of Classification Search
CPC ............. H03H 3/02; H03H 2003/021; H03H 2003/023; H03H 2003/025; H03H 9/15; H03H 9/173; H03H 9/174; H03H 9/175; H01L 41/08

USPC ......... 333/186, 195, 197, 198, 199, 219, 227; 372/32, 29.02
See application file for complete search history.

(56) References Cited

U.S. PATENT DOCUMENTS

| | | | |
|---|---|---|---|
| 6,548,942 B1 * | 4/2003 | Panasik ......................... | 310/364 |
| 6,841,922 B2 | 1/2005 | Aigner et al. | |
| 7,385,334 B1 | 6/2008 | Olsson et al. | |
| 7,456,710 B2 | 11/2008 | Yoneya | |
| 7,555,173 B2 * | 6/2009 | Barrios et al. ..................... | 385/2 |
| 8,030,823 B2 * | 10/2011 | Sinha et al. ..................... | 310/320 |
| 8,228,141 B2 * | 7/2012 | Abdolvand et al. ............ | 333/186 |
| 8,514,900 B2 * | 8/2013 | Gigioli et al. .................... | 372/32 |
| 8,525,619 B1 * | 9/2013 | Olsson et al. .................. | 333/187 |
| 8,569,936 B2 * | 10/2013 | Park .............................. | 310/364 |
| 2011/0024812 A1 | 2/2011 | Weinstein et al. | |

OTHER PUBLICATIONS

Enlund, J. et al., "Solidly mounted thin film electro-acoustic resonator utilizing a conductive Bragg reflector", Sensors and Actuators A, vol. 141, 598-602, 2008 (first available online Sep. 2007).

(Continued)

*Primary Examiner* — Dean Takaoka
(74) *Attorney, Agent, or Firm* — Withrow & Terranova, P.L.L.C.

(57) ABSTRACT

A microelectromechanical (MEM) resonator includes a resonant cavity disposed in a first layer of a first solid material disposed on a substrate and a first plurality of reflectors disposed in the first layer in a first direction with respect to the resonant cavity and to each other. Each of the first plurality of reflectors comprises an outer layer of a second solid material and an inner layer of a third solid material. The inner layer of each of the first plurality of reflectors is adjacent in the first direction to the outer layer of each reflector and to either the outer layer of an adjacent reflector or the resonant cavity.

26 Claims, 23 Drawing Sheets

(56) References Cited

OTHER PUBLICATIONS

Fedder, G.K. et al., "Technologies for cofabricating MEMS and electronics," Proceedings of the IEEE, vol. 96, No. 2, 306-322, Feb. 2008.

Hwang, E. et al., "PN-diode transduced 3.7 GHz silicon resonator," 23rd IEEE International Conference on Micro Electro Mechanical Systems (MEMS 2010), Hong Kong, 208-211, Jan. 24-28, 2010.

Kuo, N. et al., "Demonstration of Inverse Acoutstic Band Gap Structures in AlN and Integration with Piezoelectric Contour Mode Transducers," IEEE Transducers, 2334-2337, Jun. 2009.

Lakin, K. M., "Thin film resonators and filters," IEEE Ultrasonics Symposium, vol. 2, 895-906, Oct. 1999.

Marksteiner, S. et al., "Optimization of acoustic mirrors for solidly mounted BAW resonators," IEEE Ultrasonic Symposium 2005, 329-332, Sep. 2005.

Mohammadi, A.A. et al., "High-Q micromechanical resonators in a two-dimensional phononic crystal slab" Applied Physics Letters, vol. 94, 3 pages, Feb. 2009.

Newell, W.E., "Face-mounted piezoelectric resonators", Proceedings of IEEE, vol. 53, No. 6, 575-581, Jun. 1965.

Olsson III, R.H. et al., "Micromachined bulk wave acoustic bandgap devices" Transducers 2007, 317-321, Jun. 2007.

Olsson III, R. H. et al., "Microfabricated phononic crystal devices and applications", Measurement Science and Technology, 20, 13 pages, 2009 (available online Nov. 2008).

Ruby, R. et al., "Thin Film Bulk Wave Acoustic Resonators (FBAR) for Wireless Applications," IEEE Ultrasonics Symposium 2001, 813-821, Oct. 2001.

Tabrizian, R. et al., "Effect of phonon interactions on limiting the f.Q product of micromechanical resonators," Transducers 2009, 2131-2134, Jun. 2009.

Wang, W. et al., "An unreleased mm-wave resonant body transistor," MEMS 2011, 1341-1344, Jan. 2011.

Weinstein, D. et al., "Acoustic resonance in an independent-gate FinFET," Hilton Head 2010, 459-462, Jun. 2010.

Weinstein, D. et al., "Internal Dielectric Transduction of a 4.5 GHz Silicon Bar Resonator," International Electron Devices Meeting, 2007, 415-418, Dec. 2007.

Weinstein, D. et al., "Mechanical coupling of 2D resonator arrays for MEMS filter applications," IEEE Frequency Control Symposium, 1362-1365, May/Jun. 2007.

Weinstein, D. et al., "The resonant body transistor," Nano Letters, vol. 10, No. 4, 1234-37, Feb. 2010.

Xie, F.H. et al., "Post-CMOS Processing for High-Aspect-Ratio Integrated Silicon Microstructures," Journal of Microelectromechanical Systems, vol. 11, No. 2, 93-101, Apr. 2002.

Marathe, R. et al., "Si-based Unreleased Hybrid MEMS-CMOS Resonators in 32NM Technology," 2012 IEEE 25th International Conference on Micro Electro-Mechanical Systems (MEMS), 729-732, Jan. 29-Feb. 2, 2012.

* cited by examiner

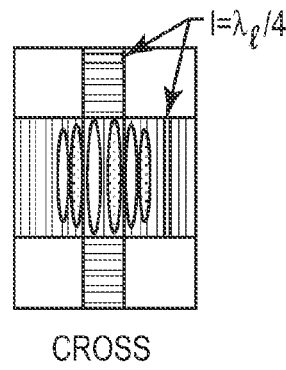
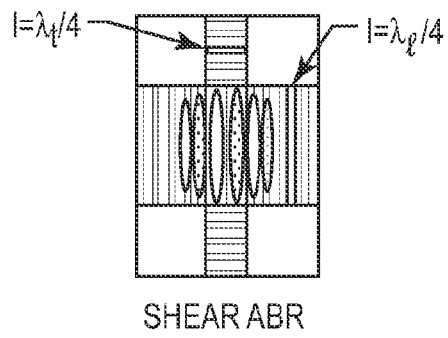
FIG. 13A          FIG. 13B
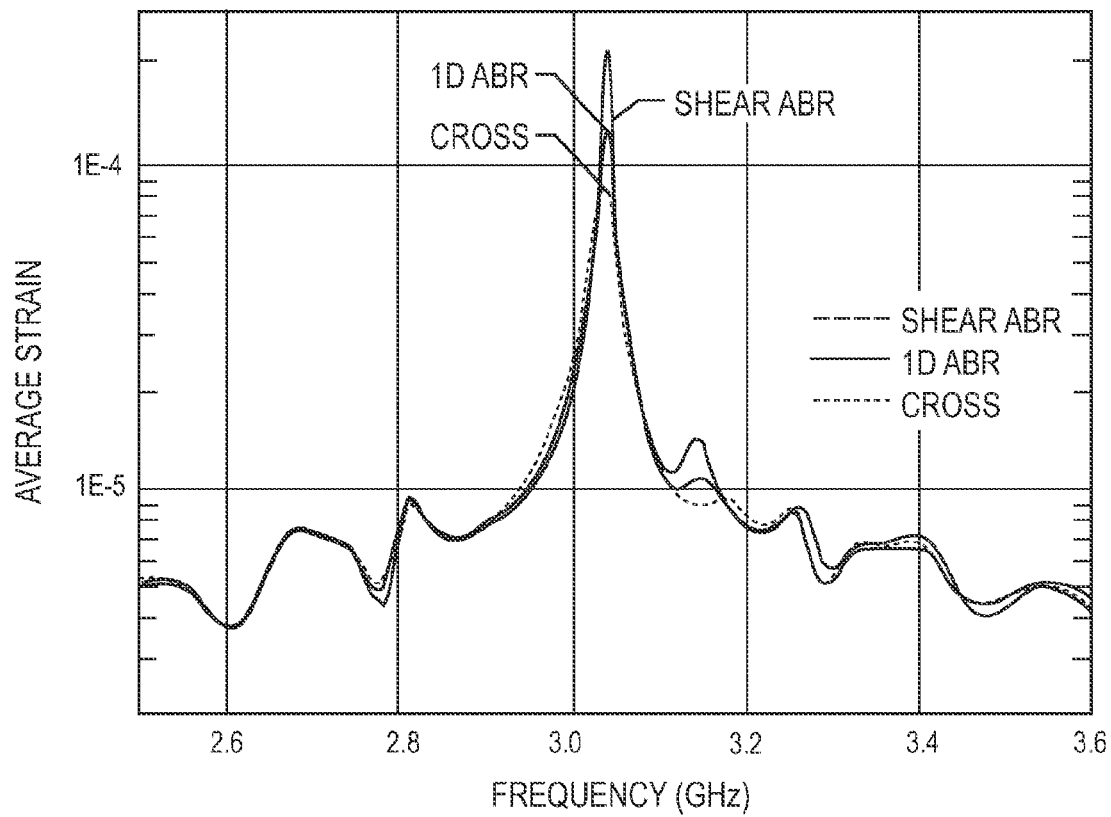
FIG. 13C

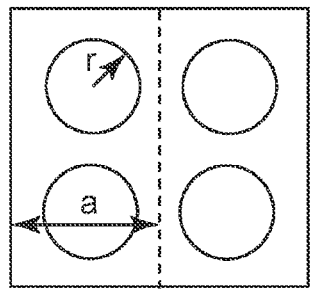
*FIG. 14A*
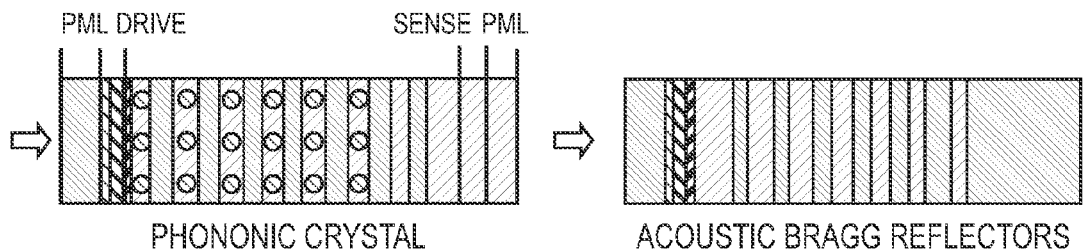
*FIG. 14B*  *FIG. 14C*
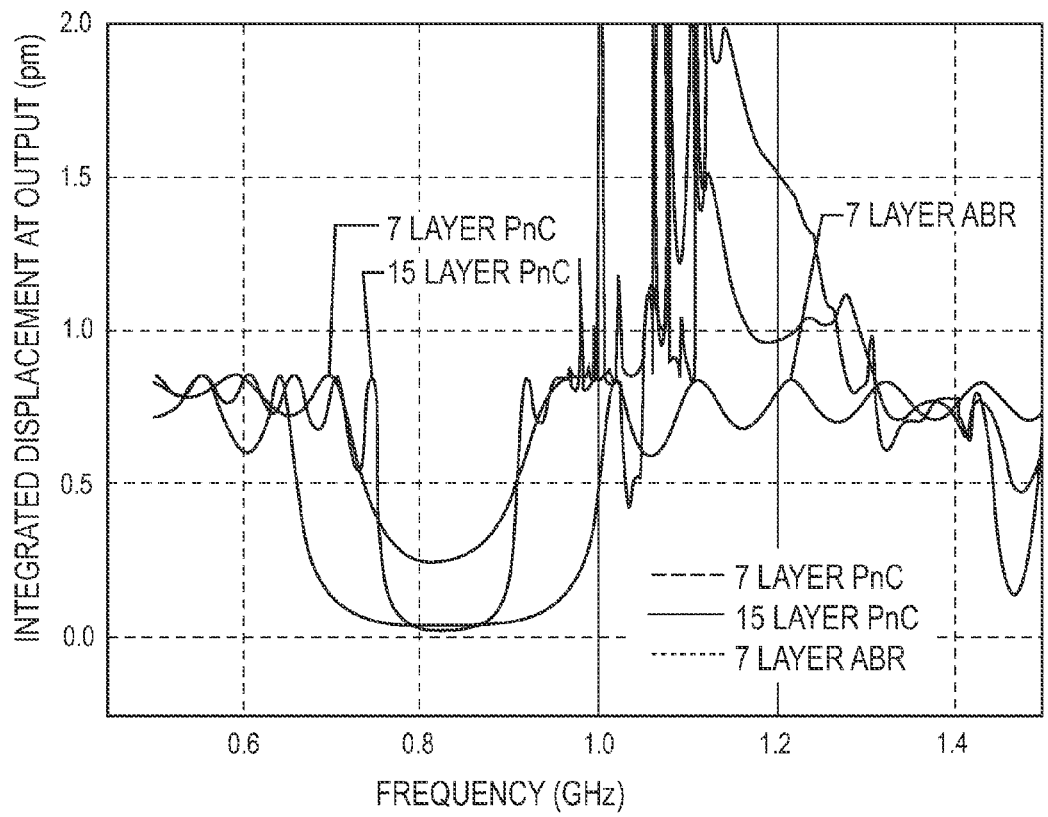
*FIG. 14D*

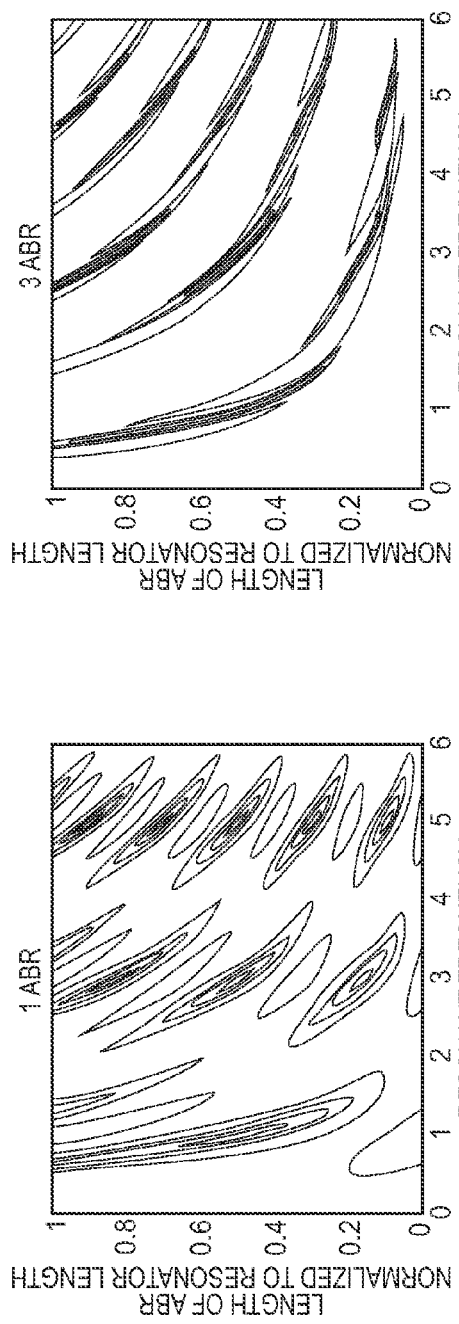
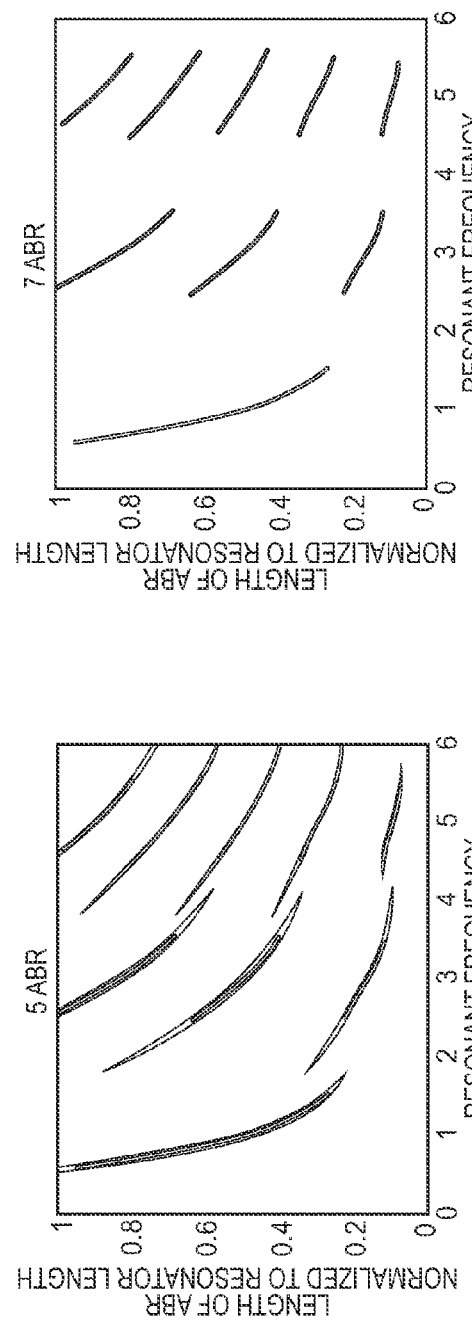
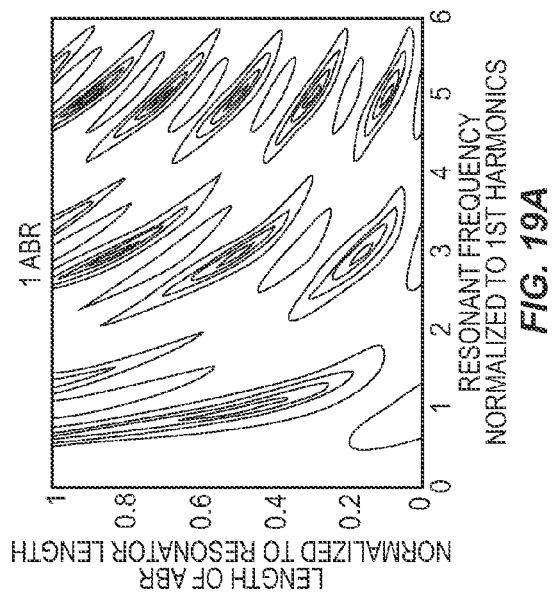
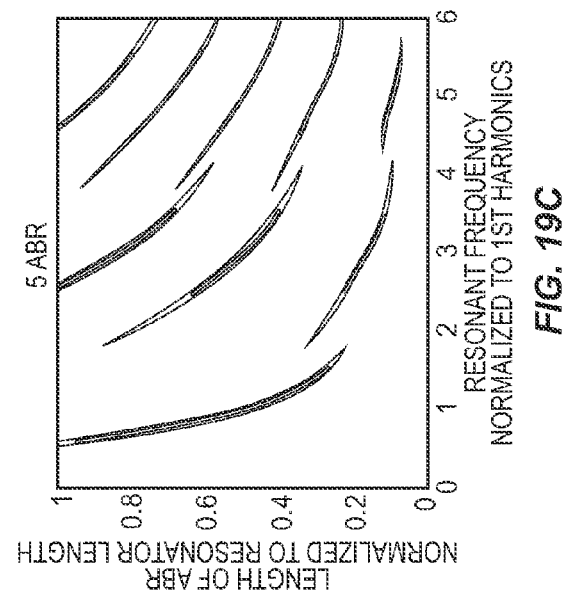
FIG. 19A
FIG. 19B
FIG. 19C
FIG. 19D

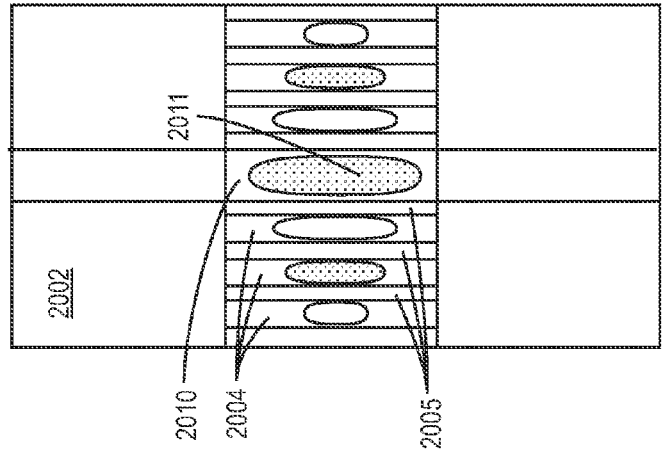
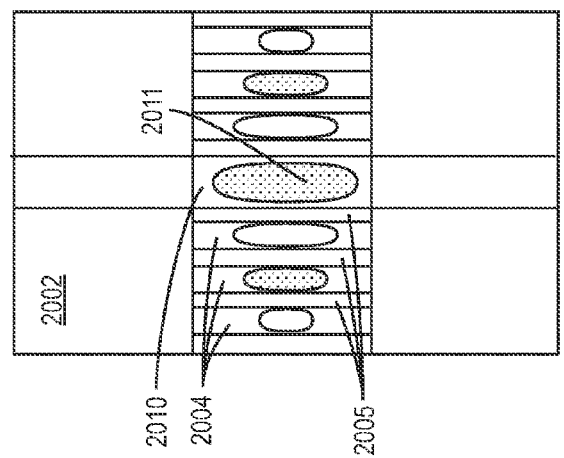
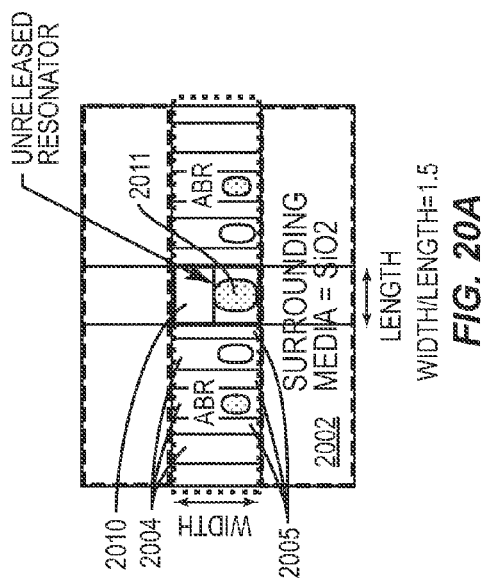
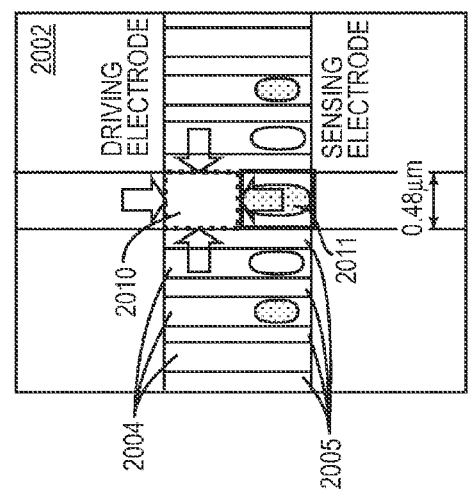

UNRELEASED MEMS RESONATOR AND METHOD OF FORMING SAME

This application claims priority to U.S. Provisional Patent Application No. 61/480,815, filed on Apr. 29, 2011, which is incorporated herein by reference in its entirety.

This invention was developed with government funds under contract number HR0011-07-3-0002, awarded by DARPA. The U.S. Government has rights in this invention.

TECHNICAL FIELD

The present disclosure relates to the design of unreleased microelectromechanical (MEMS) resonators using reflectors such as Acoustic Bragg Reflectors (ABRs).

BACKGROUND

The need for monolithic integration of microelectromechanical (MEM) devices with complementary metal-oxide semiconductor (CMOS) devices is extremely important for successful implementation of high frequency active MEM resonators. Monolithic integration of these devices can provide basic RF and mm-wave building blocks with high Q, small footprint, and low power for use in wireless communication, microprocessor clocking, navigation, and sensing applications. However, the majority of MEM resonators require a release step to freely suspend the moving structures. This necessitates complex encapsulation and packaging, causing fabrication to be restricted to MEMS-last or Back-End-of-Line (BEOL) processing of large-scale devices. Additional discussions of these techniques are described in "Technologies for cofabricating MEMS and electronics," G. K. Fedder, R. T. Howe, T.-J. King Liu, E. P. Quevy, Proceedings of the IEEE, 96 (2), 306-322 (2008), which is incorporated by reference herein for this purpose.

Many modern MEMS resonators are based on released suspended structures, which have free boundaries on all surfaces except where anchors exist for suspending support. A small class of acoustic resonators are partially released, for example, in the case of surface mounted FBAR resonators as discussed in "Thin film resonators and filters" K. M. Lakin, IEEE Ultrasonics Symposium, 895-906 (1999), which is incorporated by reference herein for this purpose, and which will be discussed in greater detail below. In these released resonators, flexural mode, longitudinal mode, shear, or surface waves are commonly excited to form acoustic resonance in the cavity created by free-free acoustic boundary conditions. Among these resonant structures, longitudinal mode resonators have been demonstrated with the highest f-Q products at $5{\sim}6 \times 10^{13}$ GHz and have even reached mm-wave frequencies, as described in "Internal Dielectric Transduction of a 4.5 GHz Silicon Bar Resonator," D. Weinstein, S. A. Bhave, IEDM 2007, 415-418 (2007), which is incorporated by reference herein for this purpose. In high frequency longitudinal resonators, loss mechanisms such as thermoelastic damping and phonon-phonon scattering are much smaller for longitudinal modes. Moreover, the longitudinal mode requires relatively simplified theoretical analysis and simulation, therefore making the design methodology of the resonator easily traceable. Examples of resonators based on longitudinal mode include: an Internal Dielectric Resonator, as described in U.S. Pat. No. 6,841,922, which is incorporated by reference herein for this purpose; and a Resonant Body Transistor, as described in "The resonant body transistor," Dana Weinstein and Sunil A. Bhave, Nano Letters 10(4) 1234-37 (2010), which is incorporated by reference herein for this purpose.

To achieve a high-yield, low cost, robust fabrication process, and enable monolithic integration of MEMS resonators into CMOS technology, resonators may be fabricated unreleased, i.e., enclosed in one or more solid material layers. Because the boundaries for the resonator are no longer "free", nor "fixed", however, the resonant cavity is poorly defined and a great amount of energy is leaked in the form of acoustic waves propagating through the boundaries of the resonator. As a result, building unreleased resonators with performance comparable to released resonators presents a number of challenges, e.g., reducing energy leakage and maintaining a high quality factor (Q).

One of the greatest benefits in building unreleased resonators is the ease of integration with modern CMOS technology, for example, in conjunction with Resonant Body Transistors (RBTs) with internal dielectric drive and Field Effect Transistor (FET) sensing up to 37 GHz, as described in U.S. Patent Application Publication 2011/0024812, Feb. 3, 2011, and "Acoustic resonance in an independent-gate Fin FET," D. Weinstein, S. A. Bhave, Hilton Head 2010, 459-462 (2010), which are incorporated by reference herein for this purpose. Fabrication of these RBTs is very similar to that of independent-gate FinFETs, which is a candidate for the next generation transistor, and it can enable amplification of the mechanical signal without the introduction of electrical parasitics. Development of unreleased RBTs at the transistor level of the CMOS stack will enable direct integration into front-end-of-line (FEOL) processing, making these devices an attractive choice for on-chip signal generation.

SUMMARY

The present disclosure relates to the design of reflectors, such as Acoustic Bragg Reflectors (ABRs), for unreleased MEMS resonators. Two significant challenges confronting the successful implementation of MEMS are those of packaging and integration with integrated circuits. Development of unreleased RF MEMS resonators at the transistor level of the CMOS stack can solve both challenges, by enabling direct integration into front-end-of-line (FEOL) processing, to ensure that these devices are viable for on-chip signal generation. The use of reflectors such as ABRs in unreleased MEMS resonators provides reduced spurious modes while maintaining high quality factors (Q). An analysis on unreleased MEMS resonators employing resonators, such as ABRs, is provided in detail below and covers design principles, effects of fabrication variation, and comparison to released devices. Additionally, a comparison of ABR-based resonators with resonators defined using phononic crystals demonstrates an order of magnitude higher quality factor (Q) for the ABR devices.

Exemplary embodiments may include a microelectromechanical (MEM) resonator comprising a resonant cavity disposed in a first layer of a first solid material disposed on a substrate; and a first plurality of reflectors disposed in the first layer in a first direction with respect to the resonant cavity and to each other. Each of the first plurality of reflectors may comprise an outer layer of a second solid material and an inner layer of a third solid material; the inner layer of each of the first plurality of reflectors may be adjacent in the first direction to the outer layer of the reflector and to either the outer layer of an adjacent reflector or the resonant cavity. The first plurality of reflectors may be Acoustic Bragg Reflectors; the first solid material and the third solid material may be the same material.

In an exemplary embodiment, the MEM resonator may also include a second plurality of reflectors disposed in the first layer in a second direction with respect to the resonant cavity and to each other, the second direction being normal to the first direction; wherein each of the second plurality of reflectors comprises an outer layer of a second solid material and an inner layer of a third solid material. The inner layer of each of the second plurality of reflectors is adjacent in the second direction to the outer layer of the reflector and to either the outer layer of an adjacent reflector or the resonant cavity.

In an exemplary embodiment, the resonant cavity may be disposed in a rectangular area of a plane defined by the first and second directions, the rectangular area having a length defined by a distance between outer surfaces of the two outermost reflectors in the first direction, and having a width defined by a distance between outer surfaces of the two outermost reflectors in the second direction, wherein the rectangular area of the plane does not contain any reflectors apart from the first and second plurality of reflectors.

In another exemplary embodiment, each of the second plurality of reflectors may have a width substantially equal to a first dimension of the resonant cavity in the first direction, and each of the first plurality of reflectors may have a width substantially equal to a second dimension of the resonant cavity in the second direction.

The MEM resonator can be further configured to amplify acoustic waves having a predetermined wavelength $\lambda$, such that each of the inner layers of the first plurality of reflectors has a thickness equal to an odd multiple of $\lambda/4$; each of the outer layers of the first plurality of reflectors has a thickness equal to an odd multiple of $\lambda/4$. Each of the inner layers of the second plurality of reflectors has a thickness equal to an odd multiple of $\lambda/4$; and each of the outer layers of the second plurality of reflectors has a thickness equal to an odd multiple of $\lambda/4$.

In an exemplary embodiment, the first and/or second plurality of reflectors may comprise at least three reflectors on either side of the resonant cavity in the first and/or second direction. In another exemplary embodiment, the first and/or second plurality of reflectors may comprise at least seven reflectors.

In an exemplary embodiment, the second solid material is composed of silicon, and the third solid material is an oxide, such as silicon dioxide. In another exemplary embodiment, the first solid material is composed of silicon dioxide.

In an exemplary embodiment, a method of forming the MEM resonator may comprise disposing a first layer of the first solid material on a substrate, defining a resonant cavity in the first layer, and finally disposing a plurality of outer layers of the second solid material in the first layer in the first direction with respect to the resonant cavity and to each other. Each of the resulting plurality of outer layers forms an outer layer of a respective one of a first plurality of reflectors, wherein each of the first plurality of reflectors comprises an inner layer of a third solid material, such that the inner layer of each of the first plurality of reflectors is adjacent to the outer layer of the reflector and to either the outer layer of an adjacent reflector or to the resonant cavity.

In an exemplary embodiment, the first solid material and the third solid material of the inner layer can be composed of the same material and are formed simultaneously during the step of disposing the first layer of solid material on the substrate.

Disposing the plurality of outer layers may comprise etching a plurality of trenches in the first layer and depositing the outer layers in the plurality of trenches.

In an exemplary embodiment, the method may further comprise disposing a plurality of inner layers of the first solid material in the first layer in the first direction with respect to the resonant cavity, the outer layers and each other, such that each of the plurality of inner layers is an inner layer of a respective one of the first plurality of reflectors.

In an exemplary embodiment, a semiconductor device comprises a solid material disposed on a substrate; and a first MEM resonator is disposed in the first solid material and configured to resonate a first frequency. The semiconductor device may also include a second MEM resonator disposed in the first solid material and configured to resonate a second frequency different from the first frequency. The semiconductor device may also include a complementary metal-oxide semiconductor (CMOS) circuit disposed in the first layer.

Those skilled in the art will appreciate the scope of the present disclosure and realize additional aspects thereof after reading the following detailed description in association with the accompanying drawings.

BRIEF DESCRIPTION OF THE DRAWINGS

FIGS. 13a-13c illustrate a plot of average strain versus frequency for different types of resonators, including exemplary embodiments.

FIGS. 14a-14d illustrate an acoustic bandgap comparison between exemplary embodiments.

FIGS. 19a-19d illustrate variances in strain output from an unreleased resonator based on differences in ABR length, resonant frequency and number of ABR layer pairs.

FIGS. 20a-20d illustrate differences in resonance between embodiments having differing ratios of resonator width to length.

DETAILED DESCRIPTION

Figure 1:
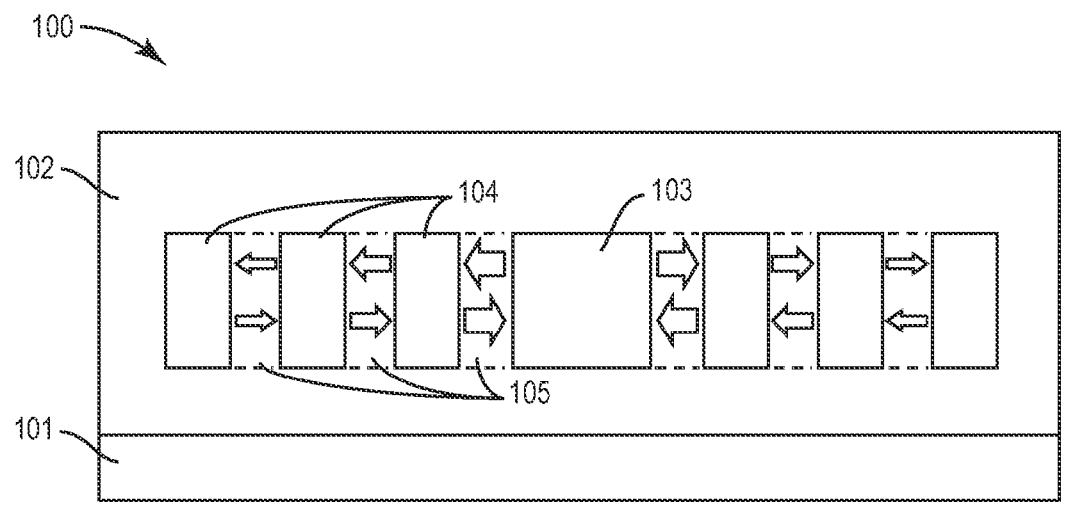
FIG. 1 illustrates a side cross-section view of an unreleased resonator according to an exemplary embodiment.

To overcome the obstacle of CMOS integration and enable high yield, a small footprint, low cost devices, and unreleased MEMS resonators are provided and described herein. Freely suspended (or released) resonators benefit from nearly perfect acoustic reflections of their surrounding medium (usually air or a vacuum). Contrarily, unreleased resonators rely on acoustic reflections at interfaces of two solid media to generate a resonant cavity. Without special design, these unreleased resonators suffer from a lower quality factor (Q) than their released counterparts. Applicants recognize that these challenges of acoustic energy leakage and subsequent reduction in Q may be addressed by acoustic wave localization. Applicants also recognize that an air boundary is not required for substantially perfect reflection, and that the multilayer ABR structure can rebuild substantially perfect reflection around an unreleased resonator. ABR is composed of periodic layers, usually comprising two or more alternating materials in space. Applicants recognize that ABR can act as a one dimensional (1D) phononic crystal to provide bandgaps for acoustic waves, blocking waves of frequency inside the bandgap, and inducing total reflection, as described in "Thin Film Bulk Wave Acoustic Resonators (FBAR) for Wireless Applications," R. Ruby, P. Bradley, Y. Oshmyansky, A. Chien and J. Larson III, IEEE Ultrasonics Symposium 2001, pp. 813-821, which is incorporated by reference herein for this purpose.

The design of unreleased resonators disclosed herein is not limited to CMOS processes, and can be implemented in other applications where a minimal or no-packaging solution is needed. Furthermore, the resonators discussed herein are not limited to the RBT or other described devices, and can encompass any bulk MEMS resonator, for example. Moreover, the energy localization method is not limited to 1D ABR, and can be any energy isolation method using constructive reflection of acoustic waves, including two dimensional (2D) or three dimensional (3D) structures. Thus, described herein is a complete integration of the resonator, and the energy localization method to enhance device performance.

Toward the goal of Front-End-of-Line (FEOL) CMOS integration, Applicants have developed a fully unreleased MEMS resonator operating at 39 GHz with Q of 129, as described in "An unreleased mm-wave resonant body transistor", W. Wang, L. C. Popa, R. Marathe, D. Weinstein, MEMS 2011, 1341-1344 (2011), which is incorporated by reference herein for this purpose. A Si bulk acoustic resonator, surrounded on all sides by $SiO_2$, demonstrates the feasibility of direct integration of the resonator into the FEOL CMOS processing, offering on-chip low power clock generation and high-Q tank filters.

Whether unreleased RF MEMS resonators are realized in a CMOS or custom process, their implementation provides high yield, low costs, robustness in harsh environments, and minimal or no-packaging solutions. However, as a result of acoustic energy leakage through wave paths into the surrounding medium, the performance of an unmodified unreleased resonator is degraded relative to its released counterpart. Applicants recognize however that this energy loss can be mitigated by adding acoustic isolation structures. Applicants propose and demonstrate two types of structures for the localization of acoustic vibrations as a substitute for suspension beams found in most released structures: the acoustic Bragg reflector (ABR) and the phononic crystal (PnC).

The ABR is named after its optical analogue, which is used as a thin film optical mirror to improve reflectivity at a desired wavelength. The ABRs are composed of periodic layers of two materials of low and high acoustic impedance. At each layer interface of the ABR, a fraction of the acoustic wave energy is reflected. To form coherent superposition of these reflected waves for a desired wavelength, these layers can be optimized at odd multiples of one quarter wavelength (¼, ¾, ⁵⁄₄, ⁷⁄₄, . . . (2n−1)/4), resulting in an overall reflectivity substantially identical to the reflectivity of a resonator having free or rigid boundary conditions. Coherent reflection can also be generated using layers having thicknesses that deviate from odd multiples of one quarter wavelength, so long as periodicity is maintained. However, more layers will be required to establish a comparable level of reflectivity.

ABRs may be employed in thickness mode piezoelectric resonators for wireless applications in high frequency integrated circuits, and may also be used with fully integrated surface micromachining technology for solidly mounted resonators (SMRs), as described in "Face-mounted piezoelectric resonators", W. E. Newell, Proceedings of IEEE, 53(6), 575-581 (1965) and K. M. Lakin, "Thin film resonators and filters" K. M. Lakin, IEEE Ultrasonics Symposium, 895-906 (1999), which are incorporated by reference herein for this purpose. These ABRs may be composed of multiple depositions of alternating materials, resulting in isolation of one dimension at a single frequency per wafer. In-plane isolation can be achieved using lithographically-defined ABRs, as demonstrated in suspended plate resonators and as described in U.S. Pat. No. 7,385,334, which is incorporated by reference herein for this purpose. This configuration enables resonators of multiple frequencies to be fabricated side-by-side on the same chip, for example.

PnCs provide an alternative solution to lithographically-defined acoustic isolation. PnCs have been recently explored by several groups for microscale applications, including acoustic mirrors for resonators in suspended plates, acoustic waveguides, and filters, as described in "High-Q micromechanical resonators in a two-dimensional phononic crystal slab", S. Mohammadi, A. A. Eftekhar, W. D. Hunt, A. Adibi, Applied Physics Letters, 94, 051906 (2009) and "Microfabricated phononic crystal devices and applications", R. H. Olsson and I. El-Kady, Measurement Science and Technology, 20, 012002 (2009), which are incorporated by reference herein for this purpose.

FIG. 1 illustrates a side cross-section view of an unreleased resonator 100 according to an exemplary embodiment. In this embodiment, the fully unreleased resonator 100 comprises a resonant cavity 103 surrounded by lithographically-defined ABRs having alternating inner-outer layers 104, 105, embedded in a homogeneous cladding layer 102 disposed over a substrate 101. In this embodiment, the inner layers 104 are the same material as the cladding layer 102. Thus, the inner layers 104 of the ABRs and the cladding layer 102 may be fabricated in the same deposition step, requiring separate deposition of the outer layers 105 only. This one-mask design enables resonator banks of various frequencies on the same chip to provide multiple degrees of freedom in ABR design. Because direct integration into FEOL CMOS processing may be desirable, resonator performance for materials commonly found in the CMOS stack is discussed below. In particular, characteristics of these unreleased structures are compared with freely suspended resonators, released resonators isolated with lithographically-defined ABRs, and PnC-based unreleased resonators.

Referring to FIG. 1, Applicants have found that surrounding the desired resonant cavity 103 of the unreleased resonator 100 with ABRs (each including the inner and outer layers 104, 105) dramatically improves the acoustic reflectivity of the resonant cavity 103 and increases Q. The ABR is composed of periodic inner-outer layers 104, 105, which are usually comprised of two or more materials alternatively located in space. The term "ABR" generally refers to an individual layer pair (such as inner-outer layers 104, 105 in this example). In some embodiments, however, one of the layers may be the same material as a surrounding medium. For example, in this embodiment, the inner layer 104 may be the same oxide material as the cladding layer 102. In these embodiments, since the outer layer may appear to be freely suspended in the cladding layer 102, the term "ABR" may alternatively be applied to the single layer that is a different material from the surrounding medium.

In this embodiment, each layer 104, 105 is designed at a quarter wavelength (or odd multiples thereof) for maximum reflectivity. By applying ABRs on the side of the unreleased resonant cavity 103, a desired free or fixed boundary condition ("fixed" or "free" depends on the acoustic impedance relationship of the two materials) can be reestablished. Moreover, this boundary is highly frequency dependent, and only free or fixed for a targeted frequency. Therefore, ABR is excellent in suppressing undesired modes. A detailed analysis of ABR will be described further below.

Figure 2:
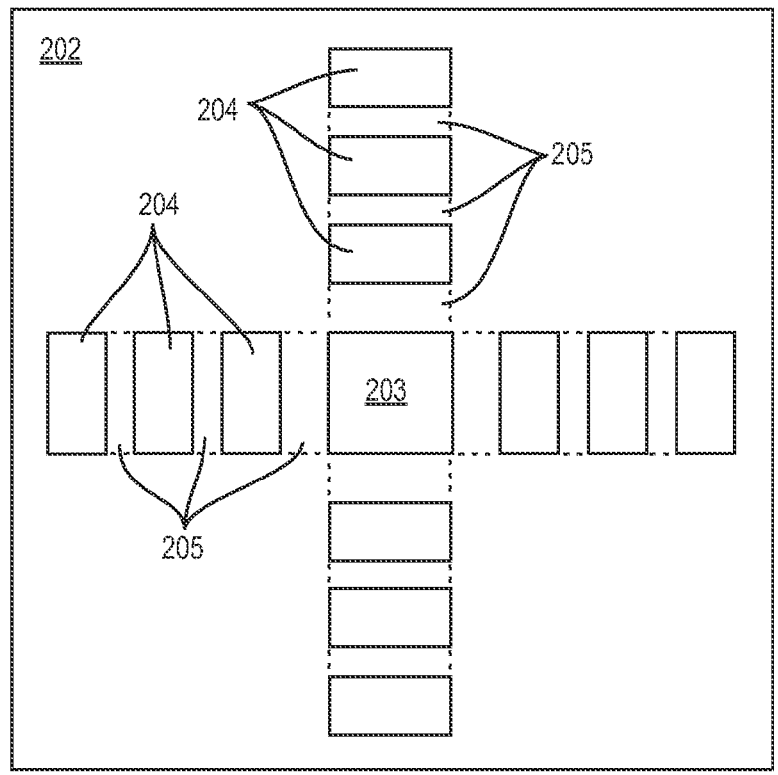
FIG. 2 illustrates a plan view of an unreleased resonator according to an exemplary embodiment.

FIG. 2 illustrates a plan view of an unreleased resonator 200 according to an exemplary embodiment, in which ABRs are arranged two-dimensionally. Here, a resonant cavity 203 is arranged in a cladding layer 202 between ABRs composed of alternating layers 204, 205 and arranged in two directions normal to each other. As will be discussed below, this specific arrangement presents a number of advantages over other two-dimensional arrangements.

Figure 3A:
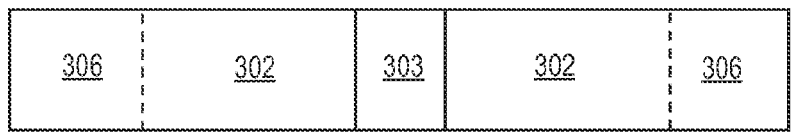
FIGS. 3a-3e illustrate frequency responses in unreleased resonators according to two different embodiments.
Figure 3B:
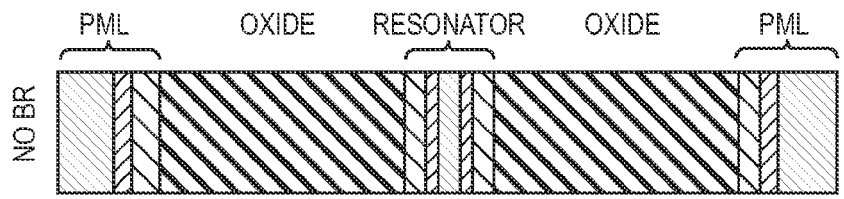
Figure 3C:
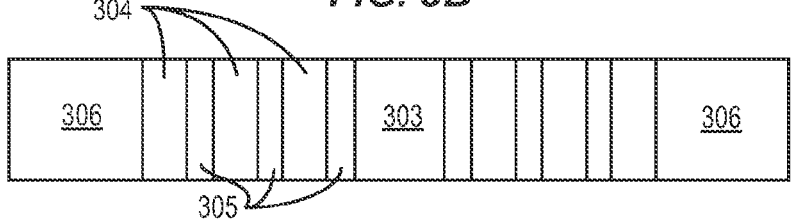
Figure 3D:
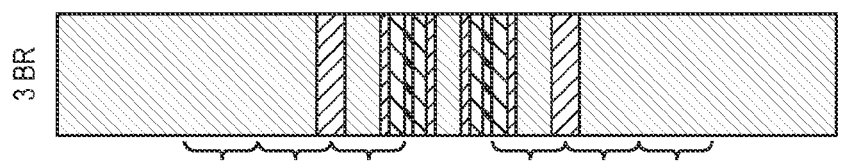
Figure 3E:
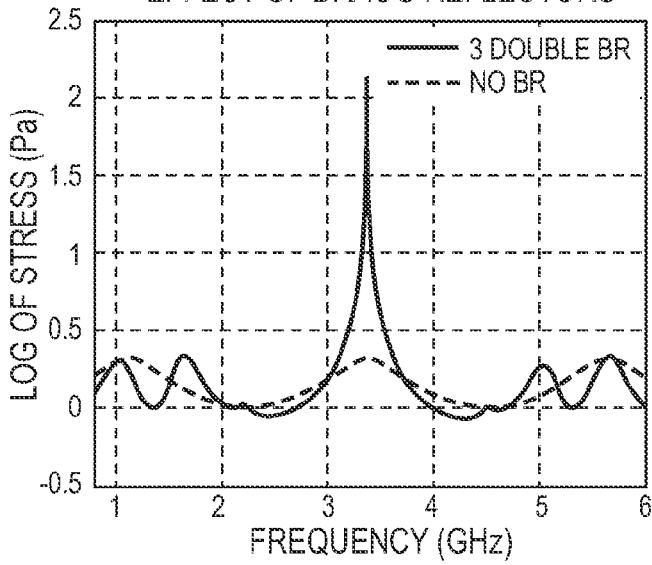

FIGS. 3a-3e exhibit a conceptual demonstration of an unreleased resonator and ABRs. FIG. 3a illustrates a side view cross-section of an unreleased resonator 300 without any ABRs. A resonant cavity 303 is disposed in a cladding layer 302, surrounded by a bounding region 306. FIG. 3b illustrates the distribution of stresses in the resonator 300, which exhibit a small peak in the resonant cavity 303 and similar small peaks at the boundaries 306. FIG. 3c, in contrast, illustrates a side view cross-section of an unreleased resonator 300 having three ABR pairs of inner and outer layers 304, 305 spaced between the resonant cavity 303 and the boundaries 306. FIG. 3d illustrates the distribution of stresses as being focused more strongly within the resonant cavity 303. FIG. 3e illustrates a plot of stress versus frequency in the two illustrated resonators that shows a dramatic increase in stress when the resonator 300 of FIG. 3c is applied with a target frequency.

In this example, the ABRs are made of $Si/SiO_2$ pairs, where both elements are the same as the material set in CMOS circuit processes. Although only three (3) layer pairs are implemented, Applicants recognize that the addition of additional layer pairs substantially improves performance up to an optimal seven ABR layers for the $Si/SiO_2$ stack, at which point the improvement in performance becomes less dramatic, and begins to be outweighed by the increase in footprint. Thus, by arranging ABRs around the resonant cavity 303, the performance of released longitudinal mode resonators can be approximated in unreleased conditions. It should be noted that the ABR is not limited to longitudinal waves. By redesigning the length of each ABR layer to target transversal waves, the ABR structure can be designed for flexural modes as well.

The significance of this design for unreleased resonators with ABR is its potential to be applied in standard CMOS technology without modifications of existing processes. Therefore, it enables monolithic integration of resonators with circuits, enabling elimination of wire-bonding for high Q oscillator and filter design, which can employ a large footprint and can be problematic with parasitics, requiring complex and power-consuming matching circuits to compensate.

In describing the operation of the ABR, it is instructive to begin with acoustic wave propagation. Analysis on acoustic wave propagation in solid and reflection at interfaces is basic to elastic wave theory and is known in the art. For conciseness and clarity, these conclusions have been omitted.

Figure 4:
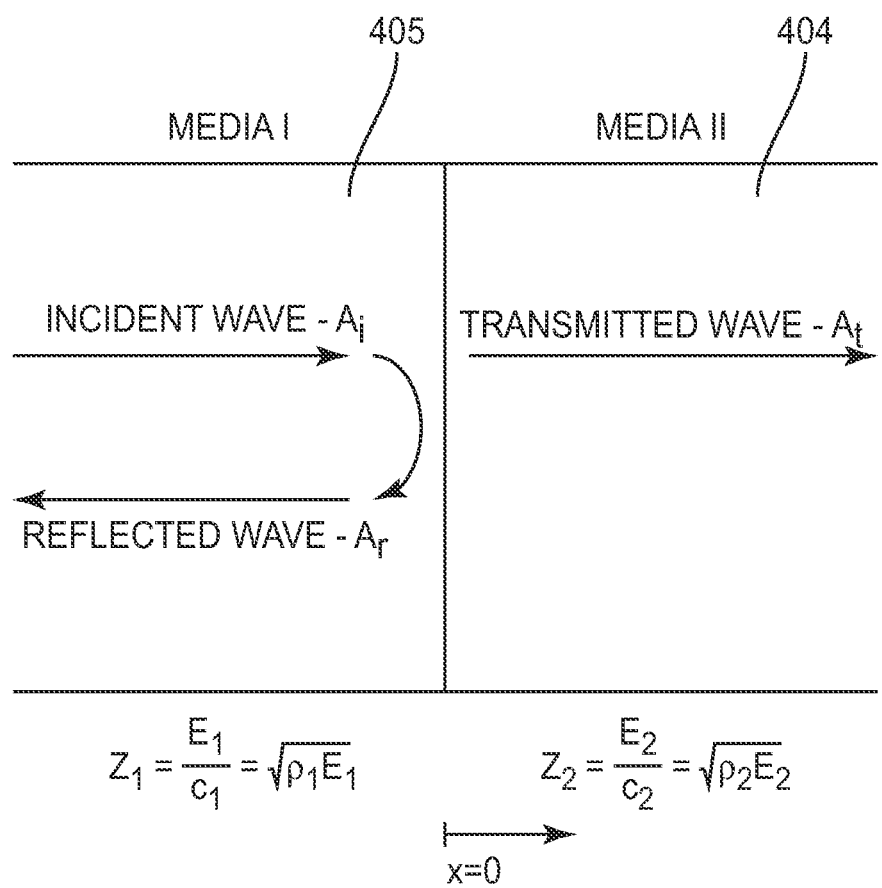
FIG. 4 illustrates reflection and transmission of acoustic energy at a boundary between two media, according to one embodiment.

Basic transmissivity and reflectivity are illustrated in FIG. 4, which illustrates reflection and transmission of acoustic energy at a boundary between two media 404, 405, according to one embodiment, wherein:

Transmissivity:

$$t = \frac{A_t}{A_i} = \frac{2Z_1}{Z_1 + Z_2} \qquad (1)$$

Reflectivity:

$$r = \frac{A_r}{A_i} = \frac{Z_1 - Z_2}{Z_1 + Z_2} \qquad (2)$$

Notably, r=1 for $Z_1 \gg Z_2$ (free boundary condition), and r=−1 for $Z_2 \gg Z_1$ (fixed boundary condition).

As outlined below, in the case of ABR boundary condition, r can be very close to 1 or −1 with a sufficiently large number of ABR double layers, thereby creating a fixed or free boundary condition for the unreleased resonator and enabling resonance in the unreleased condition.

Figure 5A:
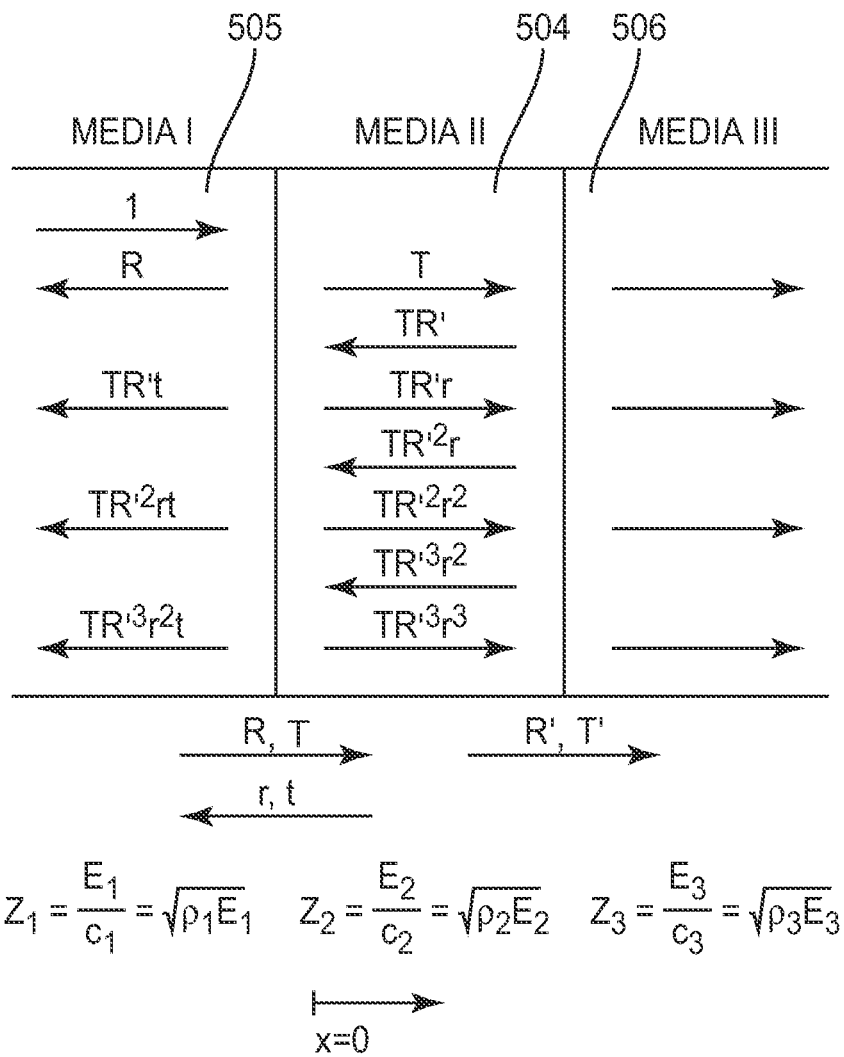
FIGS. 5a-5b illustrate reflection and transmission of acoustic energy at boundaries between different arrangements of media, according to one embodiment.
Figure 5B:
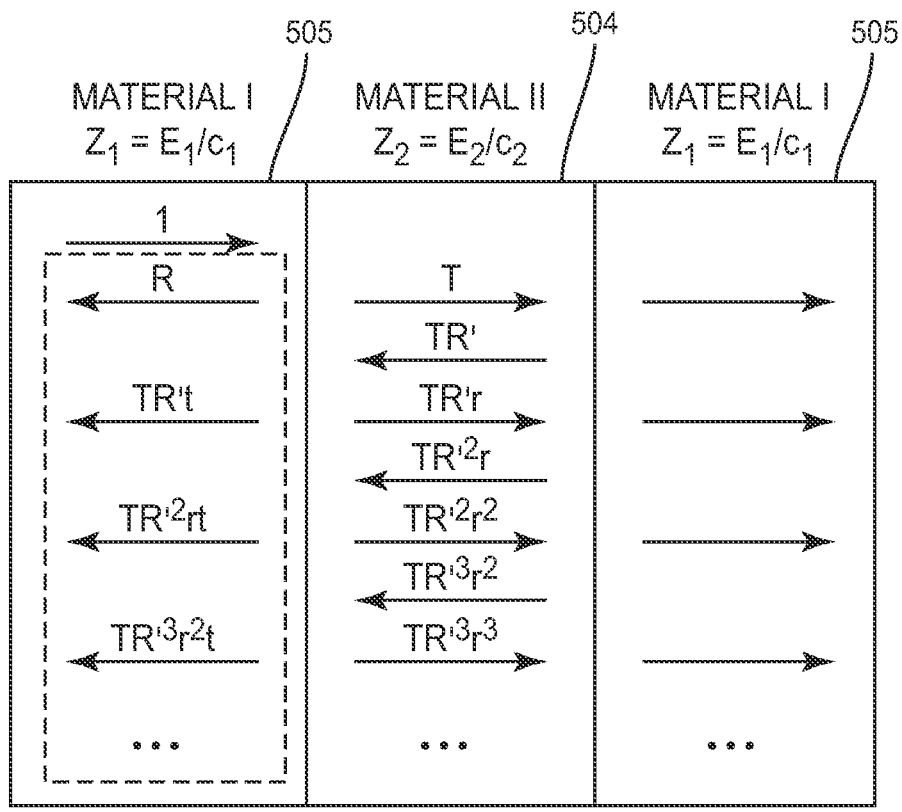

FIGS. 5a and 5b illustrate a reflectivity relationship of a medium disposed between two adjacent interfaces. In FIG. 5a, medium 504 is disposed between two different media 505, 506. In FIG. 5b, medium 504 is bounded by the same medium on both sides 505, corresponding to an ABR arrangement. Derivation of lumped reflectivity over two interfaces enables precise ABR analysis. For an acoustic wave propagating from one material over a second material into a third material, the second material will experience: reflection and transmission an infinite number of times; decaying in magnitude after each reflection or transmission; and shifting phase over propagation. By taking a sum of each reflected component, an amplitude of which forms a geometric progression, lumped reflectivity can be easily obtained.

$$\begin{aligned} R_{total} &= R + TR'te^{-i2\delta} + TR'^2 r te^{-i4\delta} + TR'^3 r^2 te^{-i6\delta} + \ldots \\ &= R + TR'te^{-i2\delta}\left(1 + R're^{-i2\delta} + (R're^{-i2\delta})^2 + (R're^{-i2\delta})^3 + \ldots\right) \\ &= R + \frac{TtR'e^{-i2\delta}}{1 - rR'e^{-i2\delta}} \end{aligned} \qquad (3)$$

In this expression, δ is the phase shift over the thickness of media II. The factor of two (2) takes into account the fact that the wave propagates over double the length of the slab of material. This expression reveals a recurrence relationship between R and R', both of which can be a lumped reflectivity rather than a natural reflectivity determined by acoustic impedance of both materials only. By applying this relation of reflectivity, the total reflectivity of a periodic structure, such as ABR, may be determined.

ABR, like its optical analogy, is characterized by its periodicity in space. When the length of each layer is designed correctly, ABR can coherently reflect an acoustic wave and generate total reflectivity (1 or −1) for a given wavelength. This analysis can be performed conveniently from the wave propagation point of view through superposition, as shown in FIG. 5b.

The acoustic impedance Z of an elastic medium is defined by material properties as:

$$Z = \frac{E}{c} = \sqrt{\frac{(1+v)(1-2v)\rho E}{(1-v)}} \tag{4}$$

where E, ρ, v are the Young's modulus, density, and Poisson's ratio respectively.

In FIG. 5b, an acoustic wave travelling to the right in material I 505 is incident on an interface with material II 504, separated into reflected and transmitted components of R and T. At the next interface, the transmitted component T is reflected at an assumed lumped reflectivity of R' from the following stack of materials. The reflected wave now travelling to the left with amplitude TR' is then reflected (r) and transmitted (t) at the first interface. As a result, infinite reflections occur inside material II 504 with amplitude decreasing in geometric progression. By summation of all the reflections, we acquire the recursion formula $$R(n) = R + \frac{Ttr(n)e^{-i2\delta_2}}{1 - rr(n)e^{-i2\delta_2}}, \tag{5}$$

in which $\delta_2$ is the phase change over the propagation length in material II 504. r(n) and R(n) are the lumped reflectivities of the nth ABR bi-layer, as shown in FIG. 5b. Similarly, another recursion formula can be acquired:

$$r(n) = r + \frac{tTR(n-1)e^{-i2\delta_1}}{1 - RR(n-1)e^{-i2\delta_1}} \tag{6}$$

Figure 6:
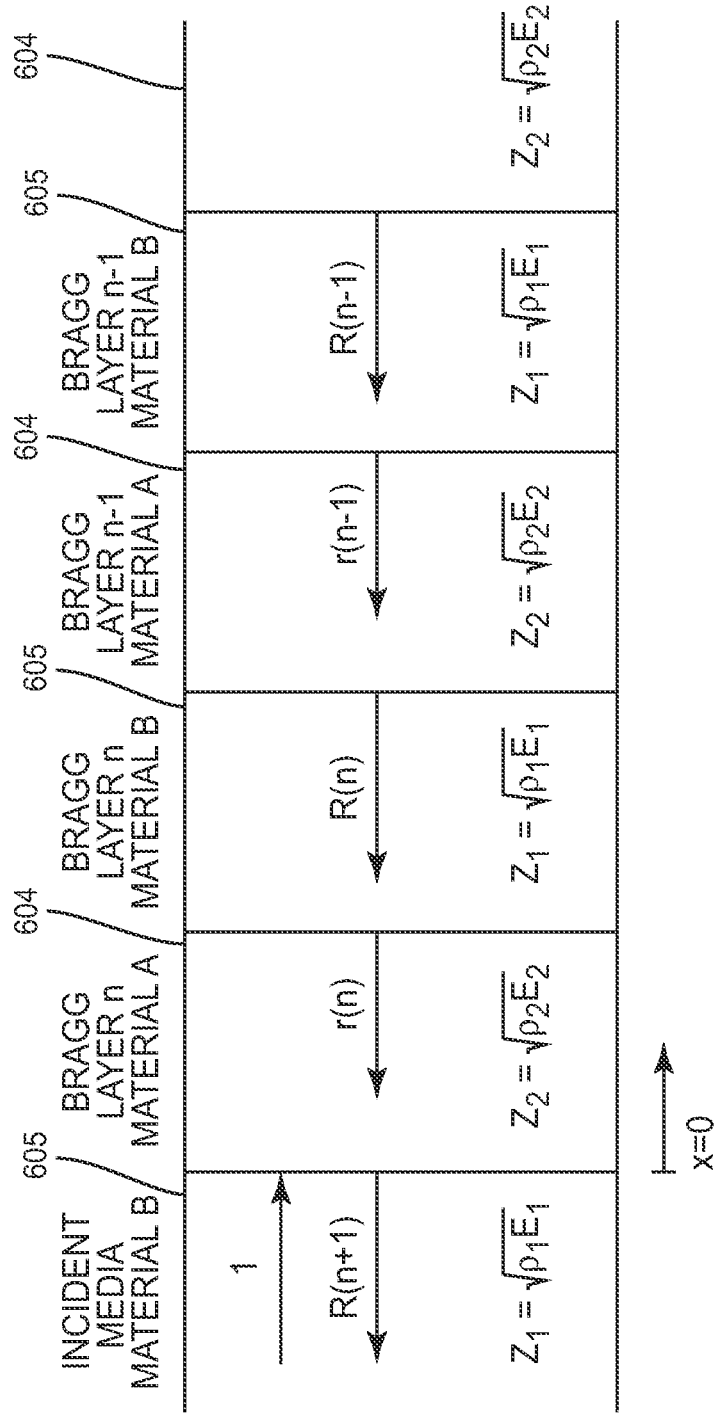
FIG. 6 illustrates reflection and transmission of acoustic energy at boundaries between alternating media layers, according to one embodiment.

With these two relations, the properties of the ABR can be extracted through numerical calculation. Applying the reflectivity recurrence relationship to ABR having alternating layers 604, 605 in FIG. 6, the reflectivity at each period of bi-layers for Acoustic Bragg Reflectors can be determined. The reflectivity recursion formulas are as follows:

$$R(1) = r_1 \tag{7}$$

$$R(n+1) = r_1 + \frac{t_1 t_2 r(n) e^{-i2\delta}}{1 - r_2 r(n) e^{-i2\delta}} \tag{8}$$

-continued $$r(n) = r_2 + \frac{t_1 t_2 R(n) e^{-i2\delta}}{1 - r_1 R(n) e^{-i2\delta}}, \tag{9}$$

in which r1, t1 are native reflectivity and transmissivity from media B to media A (B−A); and r2, t2 are native reflectivity and transmissivity from media A to media B(A−B). The expressions are:

$$r_1 = \frac{Z_1 - Z_2}{Z_1 + Z_2} \tag{10}$$

$$t_1 = \frac{2Z_1}{Z_1 + Z_2} \tag{11}$$

$$r_2 = \frac{Z_2 - Z_1}{Z_1 + Z_2} = -r_1 \tag{12}$$

$$t_2 = \frac{2Z_2}{Z_1 + Z_2} \tag{13}$$

Recurrence formulas are amenable in nature to coding. By running a code in MATLAB, acquisition of a graphic expression of ABR reflectivity is possible. As a start, CMOS materials of Si/SiO$_2$ are used in the material stack, which have an acoustic impedance ratio of 1.47 from silicon over silicon oxide. The thickness of each slab is designed as a quarter wavelength at normalized frequency.

Figure 7:
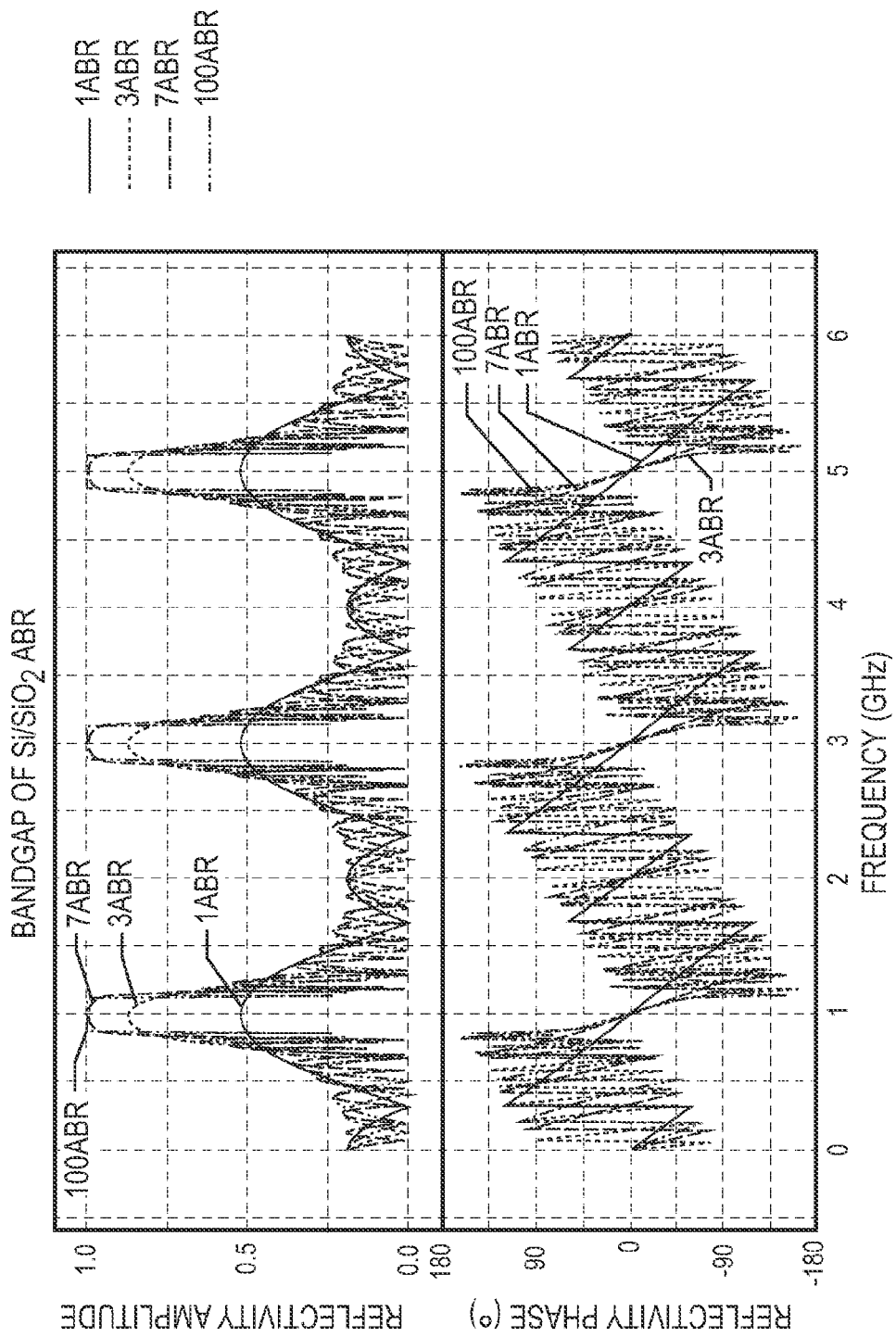
FIG. 7 illustrates reflectivity amplitude and phase of embodiments having differing numbers of Acoustic Bragg Reflectors.

An ideal ABR composed of an infinite number of bi-layers is approximated numerically using 100 ABRs. As shown in FIG. 7, this ideal Bragg reflector provides total reflection over a narrow frequency range called the bandgap. The reflectivity in the bandgap is strongly dependent on the number of ABR pairs. However, numerical results show that seven layers are sufficient to provide 98.7% reflectivity at the center of the bandgap.

FIG. 7 contains plots on reflectivity of ABR structures at different incident wave frequencies. The ABR is designed of material Si/SiO$_2$ with an acoustic impedance ratio of 1.47. Every slab of ABR material shares the same equivalent length in the sense that each length composes the same portion of wavelength in that material. The frequency is normalized to the frequency at which it is one-fourth (¼) of a wavelength in each ABR layer. The upper plot shows the amplitude of reflectivity of five (5) different ABR structures with variation in total number of ABR layer pairs; the lower plot displays the phase of reflectivity.

FIG. 7 illustrates several important points. First, reflectivity increases rapidly as the number of ABR layer pairs is increased. In other words, the reflectivity converges quickly in this example, where the impedance ratio is 1.47. Second, ABR only exhibits a "reflector" effect at certain frequencies, corresponding to frequencies having wavelengths equal to 2/(n−1) multiples of the thickness of the individual ABR layers, where n is an integer. It is only at or around those frequencies that the reflected waves can be built up coherently, resulting in a strong reflection. On the other hand, at some frequencies such as frequencies at which half wavelengths are built inside ABR, very little will be reflected. In this case, ABR actually acts as an "Acoustic Bragg Transmitter." This frequency or wavelength selectivity makes ABR a promising component in many application areas beyond unreleased resonators. Third, around an ABR's "reflector" frequency, there is a sufficiently wide range in which perfect reflection is produced. Thus, the ABR functions as a frequency band in which only selected acoustic waves are allowed to pass through. Using a concept from solid state physics, this frequency range may be referred to as an "acoustic bandgap."

Figure 8:
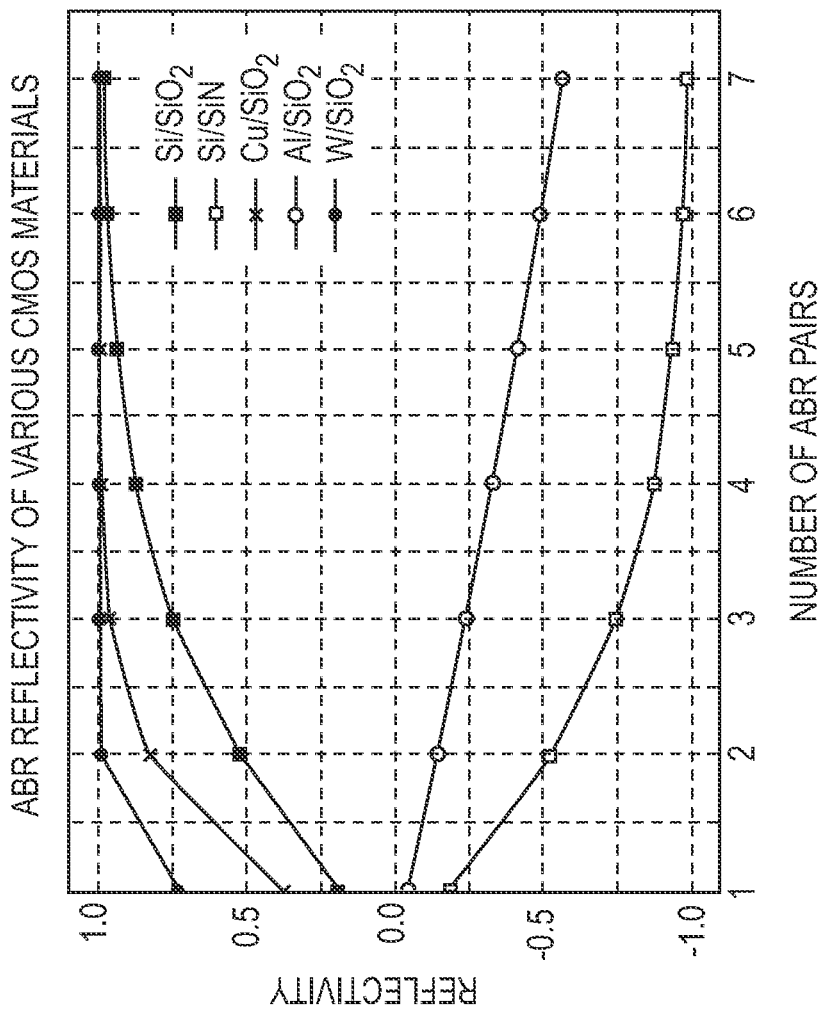
FIG. 8 illustrates a plot of reflectivity versus the number of acoustic Bragg reflector pairs for embodiments having different material compositions.

The materials composing the ABR structure will affect the convergence rate toward total reflection. Material pairs with higher acoustic impedance mismatch ratios (Z1/Z2) form a wider bandgap, and require fewer ABR pairs for the same level of reflectance. A performance comparison of several quarter-wavelength CMOS material pairs is exhibited in FIG. 8. The sign of reflectivity is determined by the order of materials in the ABR bi-layer. If the first material in the bi-layer has a higher acoustic impedance, the overall ABR will approach a free boundary condition (positive reflectivity). On the other hand, if the first material has a lower acoustic impedance, it will approach a fixed boundary condition (negative reflectivity).

Materials of large acoustic impedance mismatches, such as $W/SiO_2$, $AlN/SiO_2$, and $Mo/Al$, have previously been used to form ABR pairs in solidly mounted resonators, as described in "Optimization of acoustic mirrors for solidly mounted BAW resonators," S. Marksteiner, J. Kaitila, G. Fattinger, R. Aigner, IEEE Ultrasonic Symposium 2005, 329-332 (2005) and J. Enlund, D. Martin, V. Yantchev, I. Katardjiev, "Solidly mounted thin film electro-acoustic resonator utilizing a conductive Bragg reflector", Sensors and Actuators A, 141, 598-602 (2008) and "Post-CMOS Processing for High-Aspect-Ratio Integrated Silicon Microstructures," F. H. Xie, L. Erdmann, X. Zhu, K. Gabriel, G. K. Fedder, JMEMS 11(2) 93-101 (2002), which are incorporated by reference herein for this purpose. This mismatch minimizes the number of pairs required to achieve high quality acoustic isolation, thereby reducing the number of deposition steps during fabrication. These materials will similarly simplify fabrication for unreleased resonator ABR design, since the entire ABR structure can be defined lithographically in one step. While $Si/SiO_2$ ABRs are selected for the design and analysis in a number of exemplary embodiments, due to their FEOL CMOS compatibility, low internal loss, and small achievable footprint, it is apparent that a variety of materials may be used, including Si/metal, $SiO_2$/metal, or even three or more material combinations that can result in an acoustic impedance mismatch and constructive acoustic energy reflection. Those skilled in the art will recognize other applicable materials and combinations thereof, all of which are considered within the scope of the current disclosure.

The acoustic energy loss in unreleased resonators is analogous to anchor loss in freely suspended devices. In most released and unreleased resonators, this energy localization can be the limiting mechanism for Q. Accordingly, the following analysis is focused on the mechanical domain, taking maximum or average stain as signal output. This mechanical-only analysis in turn allows the result to be applied for various sensing mechanisms that rely on electrical signal converted from strain, such as but not limited to dielectric, piezoelectric, piezoresistive, or FET sensing.

Figure 9:
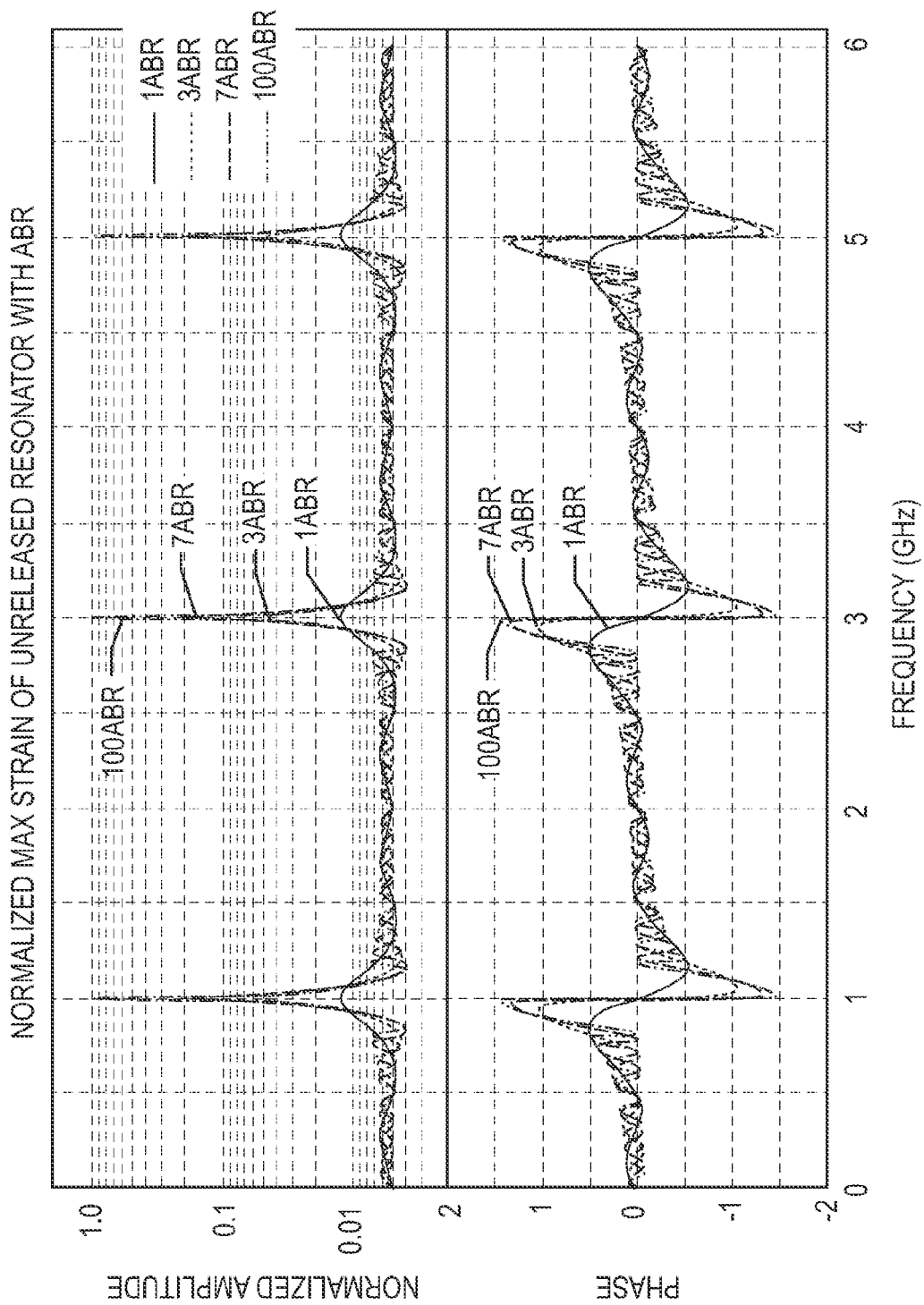
FIG. 9 illustrates strain amplitude and phase of embodiments having differing numbers of Acoustic Bragg Reflectors.

Using the superposition method outlined above, a one dimensional unreleased resonator embedded in an $Si/SiO_2$ ABR stack can be analyzed numerically with maximum strain configured as output, as shown in FIG. 9. The resonator is excited by a pair of equal and opposite forces on both edges, and after superposing wave components in both directions, strain is calculated at the center of the resonator. Resonant peaks appear periodically at odd harmonics, which correspond to the shape of the ABR bandgap. The Q of the peak also increases rapidly with the increase of ABR pairs as the reflectivity approaches integer 1, confirming the ABR analysis results in FIG. 7.

Figure 10A:
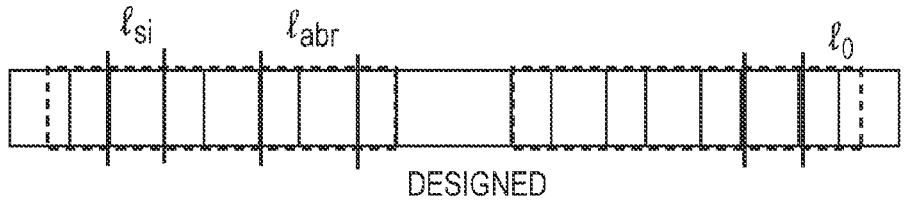
FIGS. 10a-10c illustrate the effects of variations in fabrication of embodiments on strain, frequency, and Q of the embodiment.
Figure 10B:
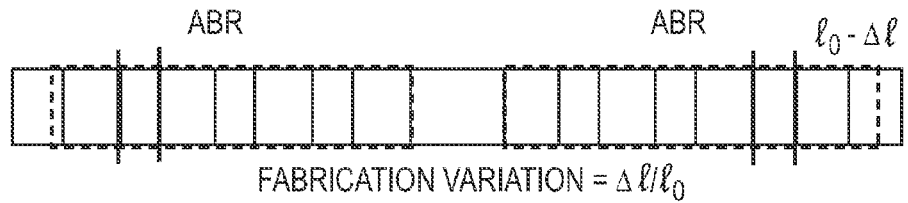
Figure 10C:
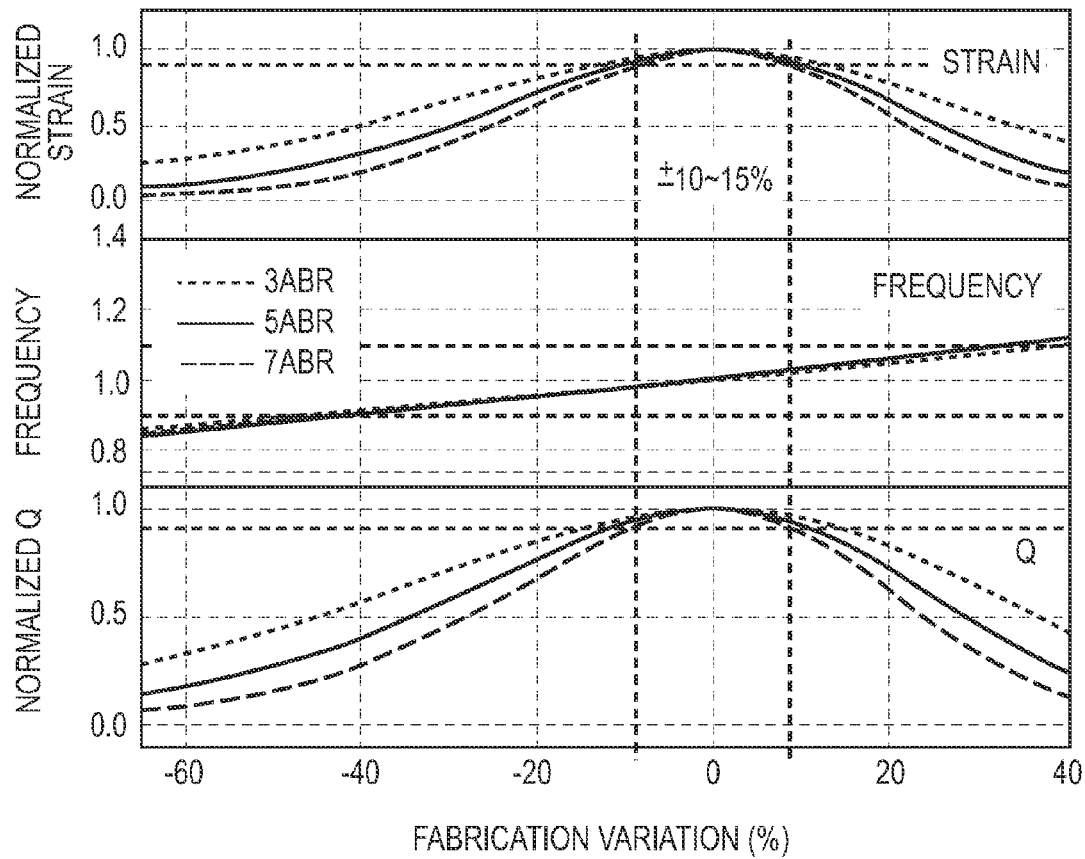

FIGS. 10a-10c illustrate the effects of variations in fabrication of embodiments on strain, frequency, and Q of the embodiment. In FIG. 10a, ABR layers 1004, 1005 are designed with respect to an resonant cavity 1003, but because both the lengths of the ABR and resonant cavity are lithographically-defined, their dimensions are subject to fabrication variations, as shown in FIG. 10b. While the finite bandgap generated by the ABR provides some level of tolerance to such variations, FIG. 10c shows how over-etching erodes the Si ABR and resonator, thereby decreasing the length ratio of the Si layer relative to the total length. This subsequently shifts performance of the entire system including frequency, Q, and signal output.

Through a parameter sweep on fabrication variation $\Delta l/l$ and ABR pair number, analysis shows that fabrication tolerances of 10-15% result in up to 10% degradation in targeted performance. The fabrication variation affects performance more as the number of ABR pairs increase, which is consistent with the narrowing of equivalent bandgap as shown in FIG. 7.

Two dimensional finite element simulations were performed in COMSOL to demonstrate the contribution of ABRs to unreleased resonator performance. In FIGS. 11a-11d, the frequency response of ABR-enhanced unreleased structures is compared with freely suspended resonators, simple unreleased resonators (no ABRs), and released resonators isolated with lithographically-defined ABRs. All resonators, driven by a pair of equal and opposite forces on both edges, are designed for first harmonic longitudinal vibrations at 1 GHz. The output signal is taken as the average strain across the entire resonant cavity. Perfectly matched layers (PMLs) are imposed at boundaries corresponding to energy sinks.

Figure 11A:
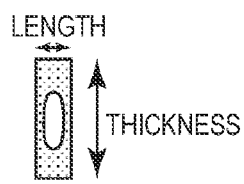
FIGS. 11a-11d illustrate a plot of average strain versus frequency for different types of resonators, including exemplary embodiments.
Figure 11B:
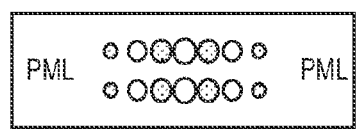
Figure 11C:
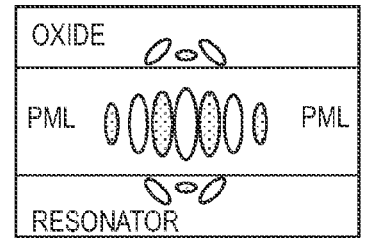
Figure 11D:
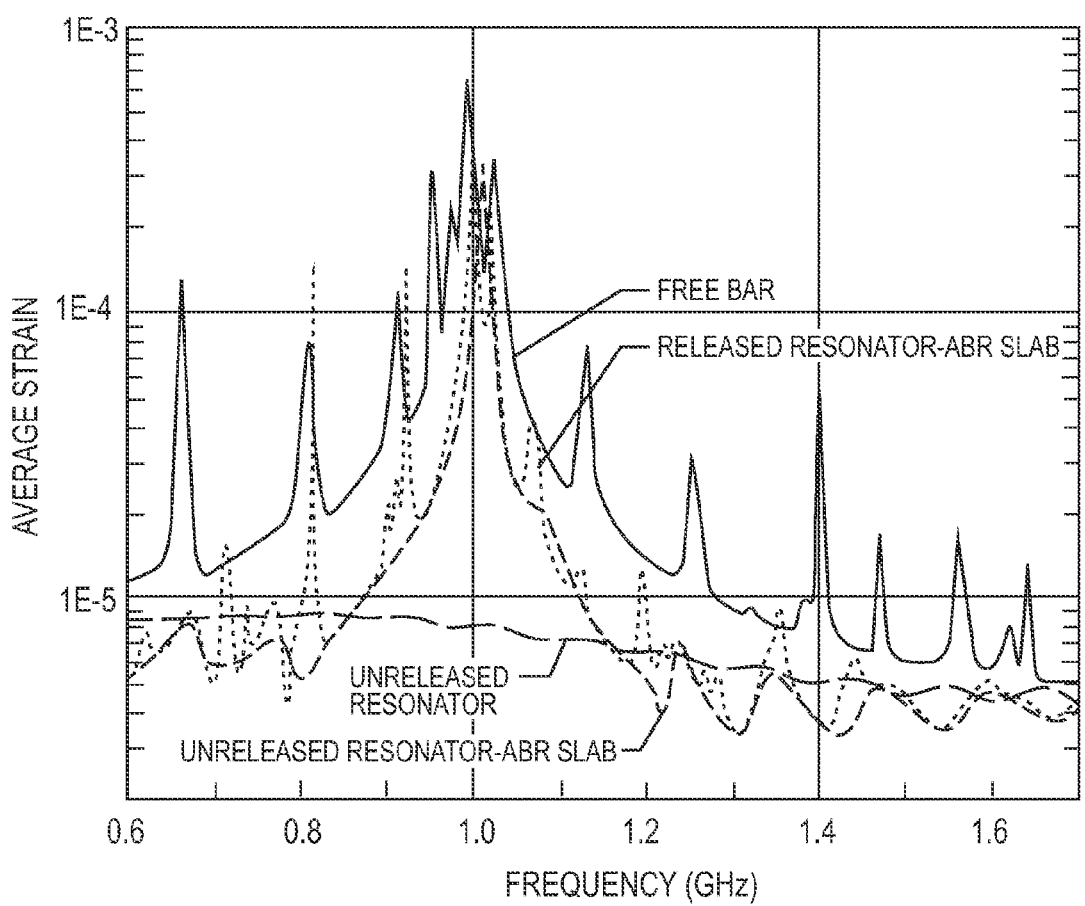
Figure 12A:
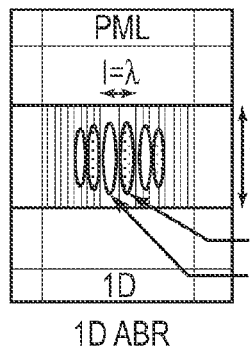
FIGS. 12a-12e illustrate a plot of average strain versus frequency for different embodiments.
Figure 12B:
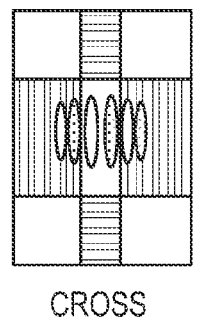
Figure 12C:
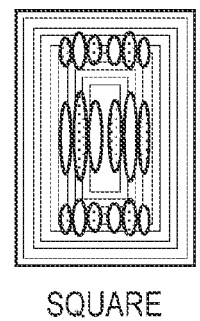
Figure 12D:
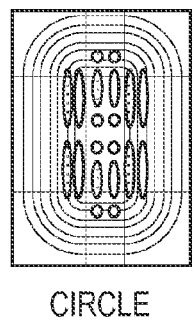
Figure 12E:
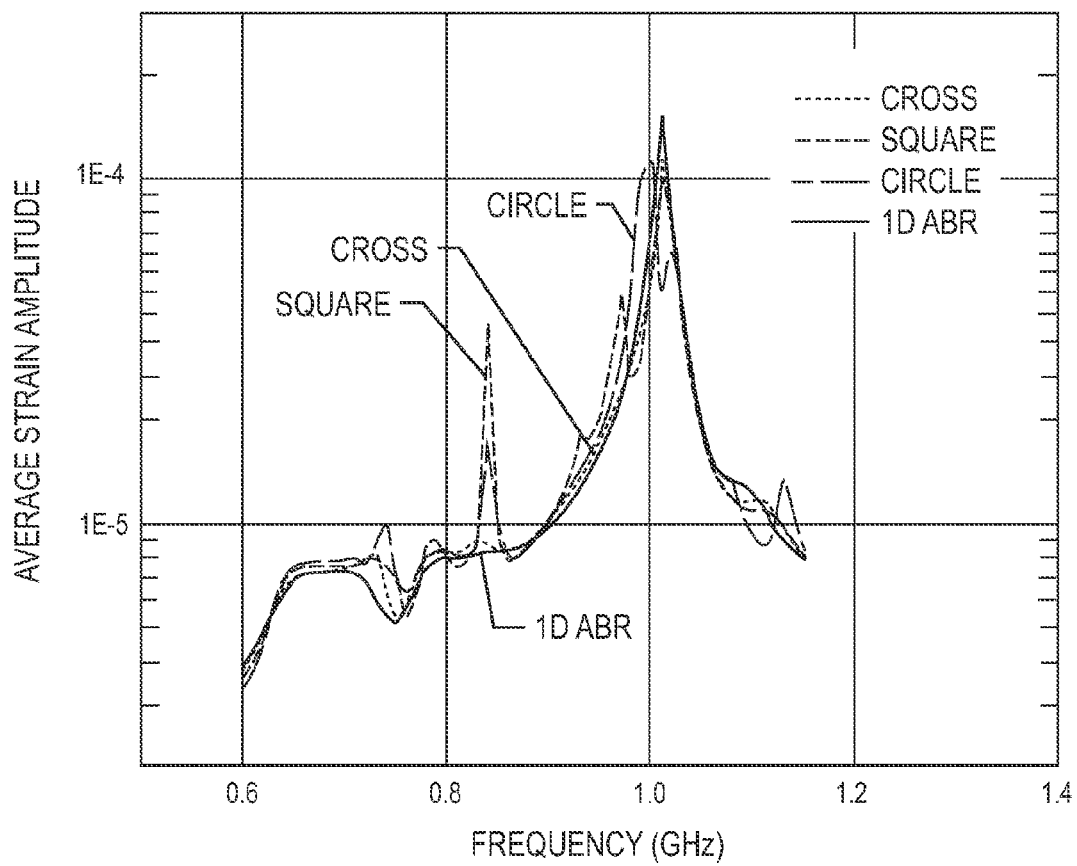

In FIG. 11a, a released bar provides the sharpest peak, which diverges for infinitesimal frequency steps due to the absence of internal damping in simulation. Due to the excitation of various plate modes, there are numerous spurious modes around the targeted frequency. On the other extreme, the unreleased resonator in oxide provides almost no peak at all, due to homogeneous energy dissipation into the surrounding medium. Focusing on the released resonator-ABR plate (shown in FIG. 11b) and the unreleased resonator-ABR structure (shown in FIG. 11c), it is apparent that, at a sufficient aspect ratio, the unreleased resonator-ABR structure provides an output signal nearly equivalent to its released counterpart. The unreleased device also exhibits spurious mode suppression, with a single high-Q peak at the desired frequency.

Of the above configurations, the unreleased resonator-ABR structure provides the purest mode, due to damping of undesired plate modes in the non-resonant direction. Depending on the aspect ratio of the device, this out-of-plane damping may contribute to a reduced Q of the targeted mode, with high aspect ratios favorable for low loss. Applicants have determined that an aspect ratio of approximately six (6) for the output of the unreleased resonator-ABR structure is sufficient to match that of the released resonator-ABR plate. This effect results from the higher thickness uniformity of the mode present in the unreleased resonator of FIG. 11d, providing a larger and more effective area for sensing.

To this point, analysis and optimization has been addressed for the side view structure of both released and unreleased resonators. The lithographic definition of the ABRs under consideration affords a third degree of freedom in design to optimize quality factors and suppression of spurious modes. In the side view case in the previous figures, the resonator and ABRs may be assumed to extend infinitely in the third dimension. In practice, however, the finite length of the structure introduces non-idealities and damping, which can be mitigated by in-plane ABR design.

FIGS. 12a-12d present several in-plane ABR configurations for a 1D second harmonic longitudinal-mode unreleased resonator. One half of the resonator is used for driving; the other half is used for sensing, providing a maximum transduction area, and further providing a selective excitation of the second harmonic. As in the case of released resonator-ABR plates, the extra reflectors contribute standing waves in the direction perpendicular to the longitudinal wave, causing signal cancellation and reduction in Q. Inclusion of corner ABRs can also introduce spurious plate modes, as exhibited in FIG. 12d.

This result suggests that the 2D ABR design should serve to minimize any 2D in-plane vibrations and target at a single mode. In the case of the longitudinal-mode resonator with 1D ABRs and as shown in FIGS. 13a-13c, to localize energy without mode distortion, side reflectors should coherently reflect only shear waves rather than longitudinal waves. The shear reflectors do not act as standing wave boundary conditions to distort the 1D longitudinal mode thereby providing higher Q and larger output signals.

This enhancement is even more evident for higher harmonics. The reduced wavelength of the sixth harmonic in FIGS. 13a-13c results in a more uniform mode along the width of the resonator. In this case, the vibrations near the sides of the resonator are increased such that the contribution from the side ABRs is larger. As shown in FIGS. 13a-13c, the sixth harmonic at 3 GHz exhibits significantly larger amplitude and higher Q than the second harmonic at 1 GHz, due to the increased width to wavelength ratio. In this case, the shear ABRs also serve to enhance the Q by a factor of two (2) relative to the 1D ABR, and by a factor of four (4) relative to the cross configuration.

The ABR can be analogized to a one dimensional phononic crystal. The PnC is an acoustic wave analogue of photonic crystals, where a periodic array of scattering elements in a homogeneous material causes complete rejection of acoustic waves at a band of frequencies. One structure used in implementation of PnCs in MEMS resonators is an in-plane wave transmission line resonator analogous to the Fabry-Perot interferometer. Typically, air holes are etched as scattering elements in a silicon slab (or slab made of other materials) to form a PnC structure. There are also solid scattering approaches to fill these holes with materials comprised of distinct acoustic impedance from the slab, as described in "Micromachined bulk wave acoustic bandgap devices", R. H. Olsson III, J. G. Fleming, I. F. El-Kady, M. R. Tuck, F. B. McCormick, Transducers 2007, 317-321 (2007), which is incorporated by reference herein for this purpose.

Solid scattering design can be utilized to localize vibrations in unreleased resonators. To compare the performance of a 1D ABR to that of a PnC, a silicon PnC with oxide-scattering elements is considered. The fabrication process is identical to that of the ABR, except for a change in layout, with holes in place of trenches defined by lithography. Similarly to the ABR, the central frequency for the PnC is dominantly dependent on periodicity, or lattice constant 'a', which approximately equals a half wavelength, while the width of the bandgap is related to the filling ratio r/a. This is illustrated in further detail in FIG. 14a. A COMSOL parameter sweep of the bandgap with respect to the filling ratio shows the widest bandgap at a filling ratio of ~0.3 for $Si/SiO_2$.

FIGS. 14a-14c illustrate an acoustic bandgap comparison between exemplary embodiments. In FIG. 14a, phononic crystals 1404 are arranged in a second material 1405. To compare the bandgap formed by the ABR embodiments described above and the PnC arrangement of FIG. 14a, a transmission line geometry is analyzed in COMSOL, with acoustic excitations generated on the left-hand side and sensing on the right, enclosed in PMLs on both ends (shown in FIGS. 14b and 14c). Periodic boundary conditions are added on top and bottom so that the bandgap property is not distorted by the width dimension. The comparison result of FIG. 14d shows that the ABR has several advantages over the PnC.

First, ABRs provide a much wider bandgap than PnCs for a given impedance mismatch of materials. Second, to achieve a near-perfect bandgap, ABR requires far fewer layers than the PnC, thus permitting a smaller footprint. Finally, at frequencies beyond the bandgap, there exist spurious eigenmodes for the PnC, which can result in undesired strong resonance. On the other hand, the ABR provides a substantially perfect bandgap without introducing spurious modes.

Figure 15A:
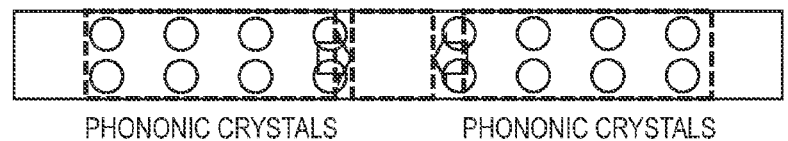
FIGS. 15a-15c illustrate a plot of average strain versus frequency for different embodiments.
Figure 15B:
Figure 15C:
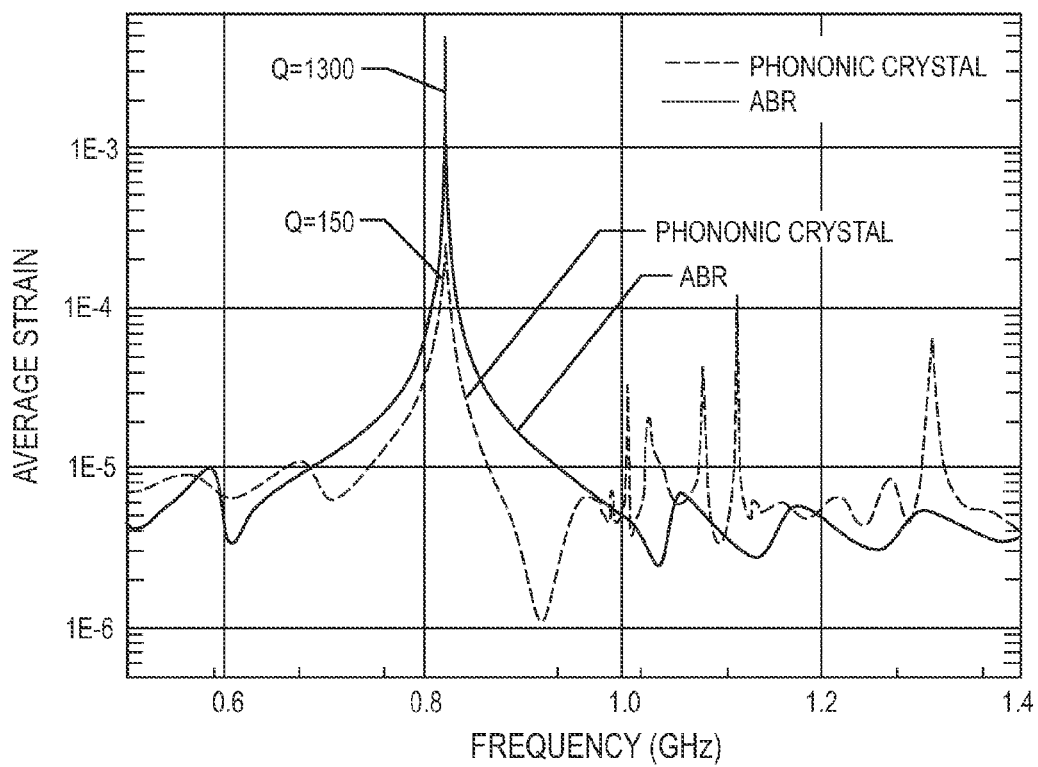

Based on these advantages, if we compare the PnC or ABR applied to a resonator driven on both ends for the same footprint, the ABR offers clear benefits, with a high Q peak and suppression of spurious modes at both low and high frequencies (shown in FIGS. 15a-15c).

As described above, the design of unreleased resonators with ABRs is optimized to suppress spurious modes and enhance quality factors. With sufficient thickness-to-length aspect ratios, the unreleased design is able to provide signal level and Q that are comparable to their released counterparts. At high frequencies (>1 GHz), where resonator damping is dominated by anchor loss, the unreleased resonators with ABRs can even outperform released devices, as described in "Effect of phonon interactions on limiting the f.Q product of micromechanical resonators," R. Tabrizian, M. Rais-Zadeh, F. Ayazi, Transducers 2009, 2131-2134 (2009), which is incorporated by reference herein for this purpose.

Figure 16:
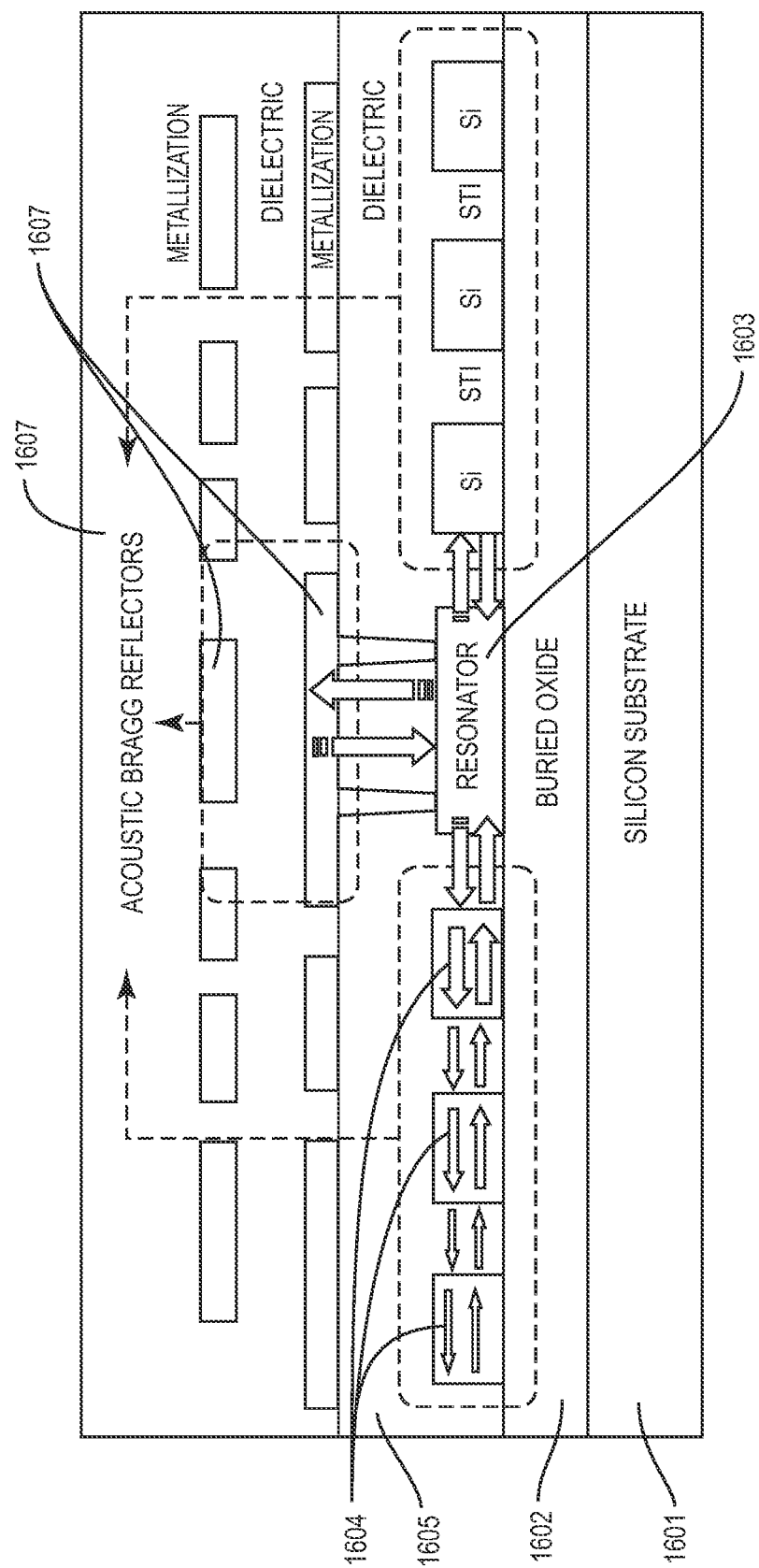
FIG. 16 illustrates a side cross-section view of an unreleased resonator according to an alternative embodiment.

Although the above embodiments describe one dimensional (1D) and two dimensional (2D) structures, ABRs can be employed in the third dimension as well to increase resonance and frequency isolation. FIG. 16 discloses an alternative embodiment of an unreleased resonator 1600 comprising an oxide layer 1602 disposed over a substrate 1601, with ABR elements 1605 surrounded by a first dialectric layer 1604, which acts as the second ABR material. A second dialectric layer 1607 is disposed above the resonant cavity 1603, containing reflector layers 1606 arranged to form ABRs in the vertical direction as well.

In this and other embodiments, ABRs may be formed by a CMOS Silicon-on-Insulator (SOI) process. By implementing Shallow Isolation Trenches (STI) on the side, ABR boundary conditions are formed on both sides of the unreleased resonator to form a longitudinal mode resonance. In addition, metal/dielectric layers on top can also be patterned to favor the energy localization in the resonator for resonance enhancement.

Figure 17:
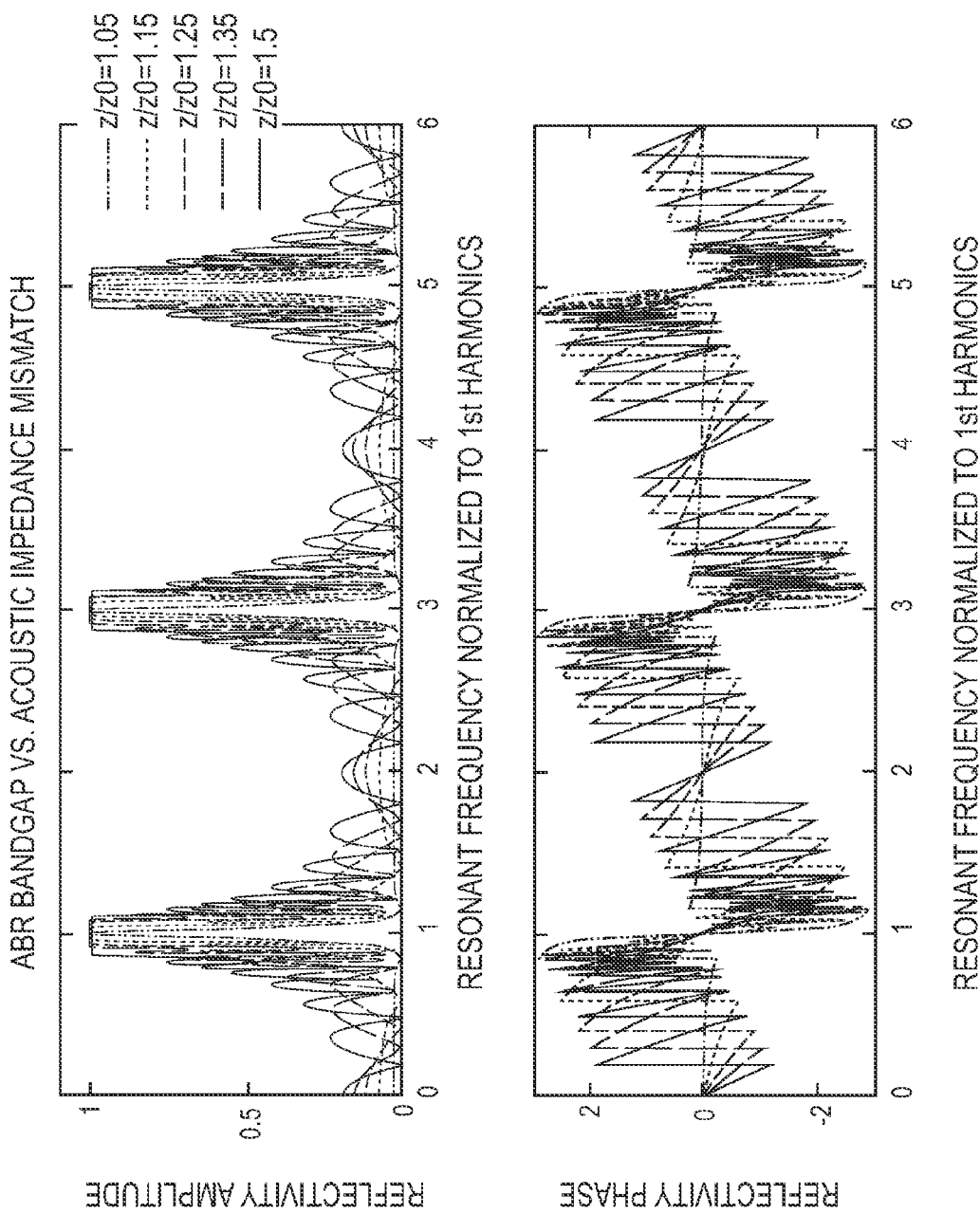
FIG. 17 illustrates reflectivity amplitude and phase of embodiments having differing acoustic impedances.

FIG. 17 illustrates variations in bandgap with respect to acoustic impedance ratio of different materials. In particular, FIG. 17 reveals that the bandgap increases as the two materials become more distinct in acoustic impedance (i.e., in which bandgaps of $Si/SiO_2$ material stacks are close to the curve representing $z/z0=1.5$). Although the bandgap decreases and consequently reduces the "reflector" ability with a reduction in impedance mismatch, the transmissivity at even multiples of normalized frequencies increases, characterizing the low-impedance mismatch ABR structures as an excellent "transmitter".

Figure 18:
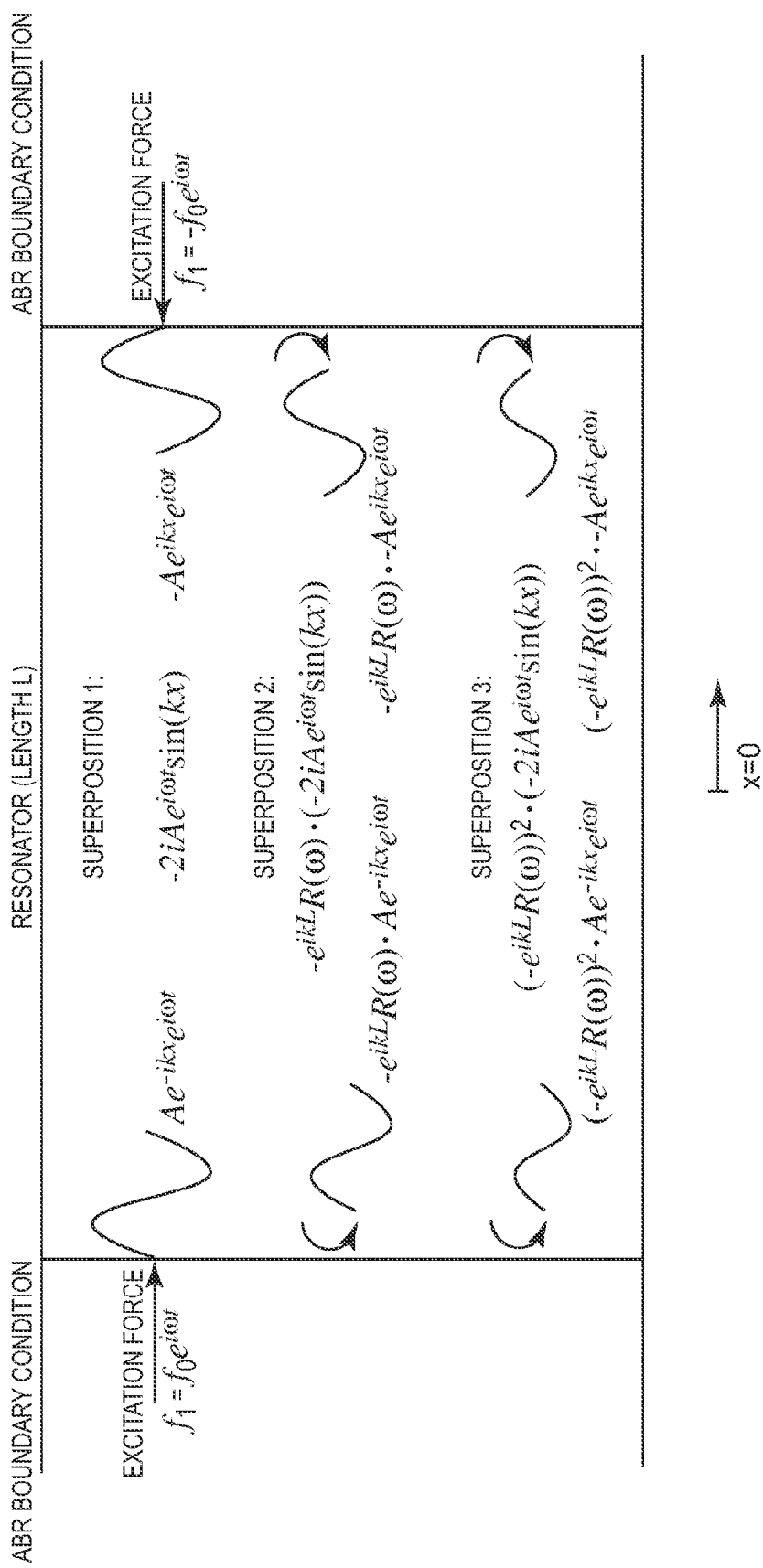
FIG. 18 illustrates resonance of excitation force within an unreleased resonator, according to one embodiment

A resonator response can be obtained by applying the above-described results on an unreleased resonator, as illustrated in FIG. 18. The resonator is modeled as a bar of length L, with longitudinal acoustic wave propagation back and forth inside the cavity created by the ABRs. Sinusoidal excitation forces of equal amplitude and opposite phase are applied on both boundaries, simulating the commonly symmetric excitation in the resonator. The amplitude of propagating longitudinal waves can be derived from force balance at a boundary as:

$$A = \frac{f_0}{ikE}, \quad (14)$$

in which $f_0$ is the amplitude of sinusoidal excitation force, k is a wave number, and E is Young's modulus.

The two waves propagating in opposite directions form a standing wave of complex amplitude of $-2iA$, as indicated in FIG. 18. With both waves propagating to the ABR boundary condition, each is reflected with a phase and amplitude change of $R(\omega)$. Taking propagation distance and direction into account, the next set of standing waves is formed with amplitude $-e^{\wedge}(ikL)*R(\omega)$ smaller. Continuing this amplitude decrease process an infinite amount of times, the final amplitude of standing waves from the sum of geometric progression is calculable, as shown in FIG. 18.

$$A_{total} = -2iAe^{i\omega t}\sin(kx)(-e^{ikL}R(\omega)) + (-e^{ikL}R(\omega))^2 + \ldots ) \quad (15)$$
$$= \frac{-2iAe^{i\omega t}\sin(kx)}{1 + e^{ikL}R(\omega)}$$

Resonant strain, rather than resonant amplitude, is commonly extracted to detect a signal. Strain is determined by taking the derivative on x:

$$\varepsilon = \frac{dA_{total}}{dx} \quad (16)$$
$$= \frac{-2ikAe^{i\omega t}\cos(kx)}{1 + e^{ikL}R(\omega)}$$
$$= \frac{-\frac{2f_0}{E}}{1 + e^{i\omega Llc}R(\omega)}\cos(kx)e^{i\omega t}$$

Substituting the numerical result of $R(\omega)$ from above, output from unreleased resonator with ABRs can be acquired. Notably, signal amplitude is dependent on the excitation frequency at two points: the frequency-dependent reflectivity of ABRs; and the phase shift from propagation delay inside the resonator itself.

FIGS. 19a-19d illustrate variances in strain output from an unreleased resonator based on differences in ABR length, resonant frequency and number of ABR layer pairs. As shown in FIGS. 19a-19d, the numerical calculation results described above reveal several significant facts about unreleased resonator with ABRs. First, with the increase of excitation frequencies, first, third, and fifth harmonics are successfully excited in the resonator, all of which are dependent on the dimensions of the ABR, due to the fact that all of them satisfy the "quarter wavelength" requirement. Second, a max signal is acquired at geometries corresponding to half wavelengths inside the resonator (just as with released resonators) and quarter wavelengths in the ABRs. Peaks still exist for frequencies around quarter wavelengths inside the bandgap, but at smaller amplitudes due to a partial destructive build up inside the resonator. Third, with the increase of the ABR number, the selectivity of ABRs is enhanced and quality factors are improved. In fact, since internal damping is not taken into account in this analysis, the strain output will dramatically increase with an infinite number of ABR, which matches the previous conclusion that an infinite number of ABRs provide perfectly fixed or free boundary conditions at targeted frequencies inside the bandgap.

These favorable theoretical results have been further verified by FEA simulation in COMSOL for two reasons. First, the actual resonator may not be wide enough to be one dimensional. Second, using actual excitation force may be more complicated than a pure two-edge excitation. Therefore, spurious modes can be potentially excited and represented in the output signal.

In a structural mechanical module in COMSOL, unreleased resonators 2000 with ABRs 2004, 2005 in an oxide layer 2002 are represented by top view 2-D simulation, as displayed in FIGS. 20a-20d. These applied forces can be achieved by capacitive force in a real device via a driving electrode 2010, and strain in sensing electrodes 2011 can be sensed by a capacitor, FET, or any other possible means. For this simulation, only mechanical simulations were carried out on the electro-mechanical resonator, with excitation force and integration of strain applied as driving and sensing respectively. The result shows that the wider the resonator and ABRs, the larger the signal, and the purer the mode (see FIG. 21). This conclusion corresponds with the theoretical results because the wider the structure, the more one dimensional the resonance becomes, and the longitudinal mode between two ABR boundaries dominates and contributes more to the output signal. There are always waves propagating out of the shorter sides of the resonator, which lead to energy loss. However, as long as the resonator is designed with sufficient width, this portion of leaked energy becomes negligible.

Figure 21:
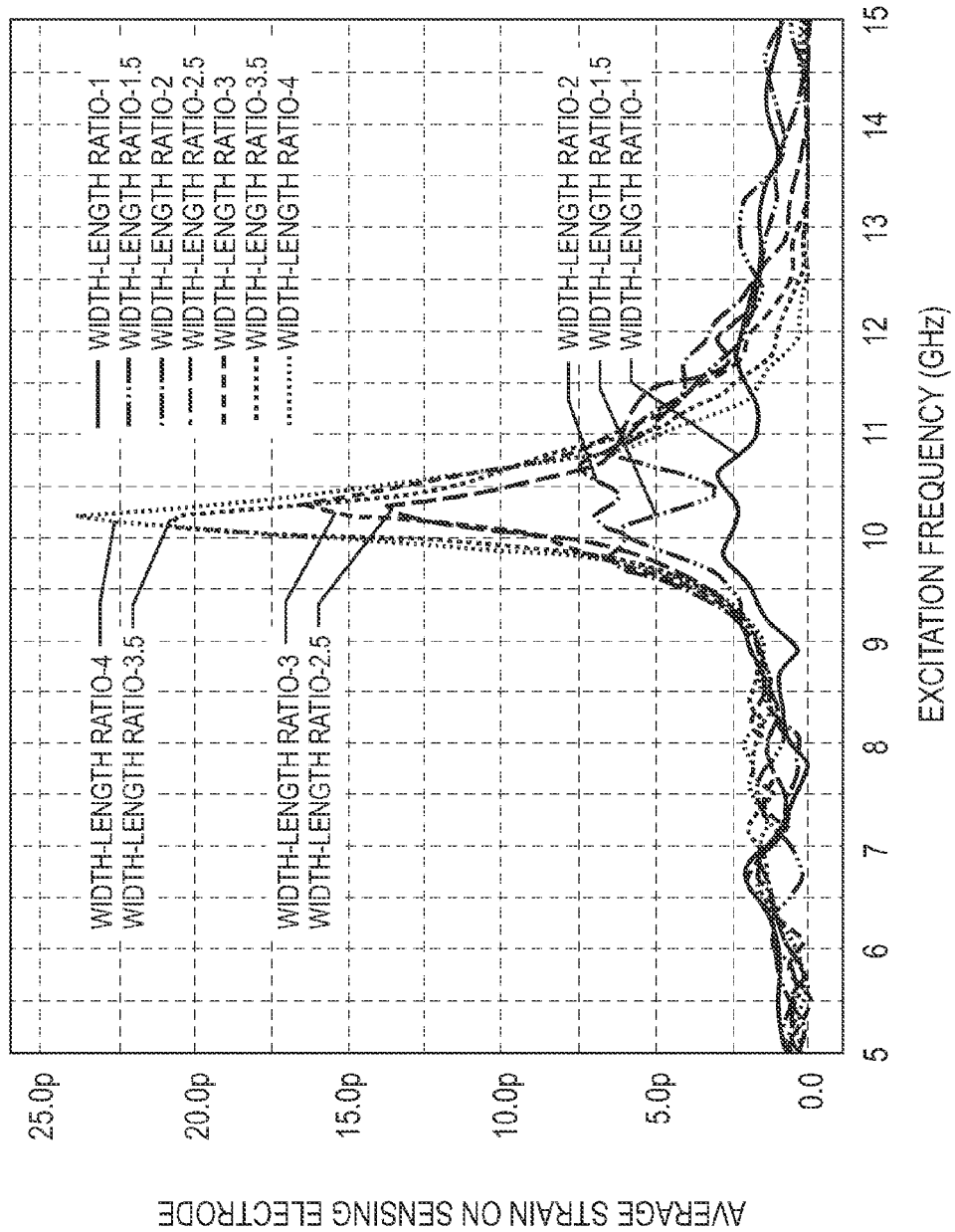
FIG. 21 illustrates a plot of average strain versus frequency for embodiments having differing ratios of resonator width to length.
Figure 22:
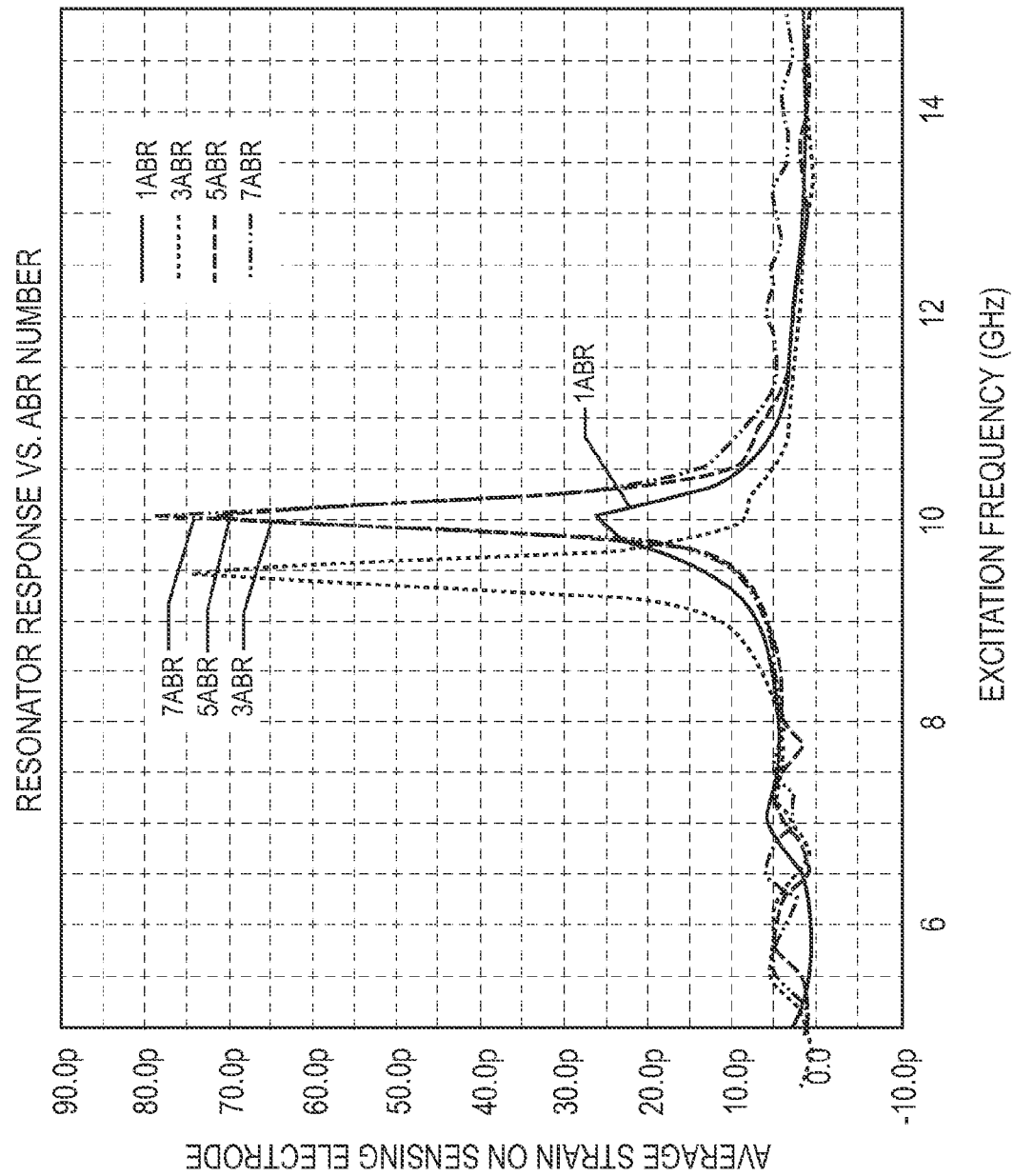
FIG. 22 illustrates a plot of average strain versus frequency for differing numbers of Acoustic Bragg Reflectors.

Further analysis in COMSOL provides integration plots of strain on the sensing electrode, as shown in FIG. 21. By dividing total area, an average strain on the sensing electrode can be determined, which represents signal strength. It can be observed that for smaller width, the longitudinal mode is not as prominent; however, as width increases, the resonance becomes stronger and purer. Similarly, FIG. 22 illustrates that as the ABR number increases, the signal becomes stronger. Both of these results are predicted by the analytical model.

The exemplary embodiments disclosed herein have a number of advantages over other resonator arrangements. For example, researchers have previously demonstrated partially unreleased MEMS resonators, in which the resonator is "surface mounted" on a substrate. For the surface mounted FBAR resonator, there can be ABR applied beneath the resonator to reduce energy loss, as described in U.S. Pat. No. 7,456,710, which is incorporated by reference herein for this purpose. Applicants' exemplary embodiments differ in several respects. First, the surface mount FBAR is only a half-space 1D design, and requires one released surface of the resonator to operate. In contrast, the unreleased design is at least 1D full-space, and it can be extended to two and three dimensions (2D and 3D). In other words, Applicants' exemplary embodiments have a larger range of energy isolation. Second, the surface mount FBAR requires five (5) of its six (6) surfaces to be released in order to operate. On the other hand, Applicants' exemplary embodiments can be fully encompassed in solid media and isolated from air, eliminating the need for special packaging for device stability, and can further be operated in extreme environments. Third, the 1D-3D ABRs of Applicants' exemplary embodiments can be defined lithographically as opposed to by film thickness (in the case of surface mount FBARs). Thus, multiple unreleased resonators with different resonance frequencies can be fabricated side by side on the same die or wafer using a single set of masks in Applicants' exemplary embodiments.

Another commercially available product is the Surface Acoustic Wave (SAW) Resonator, as described in U.S. Pat. No. 7,456,710, which is incorporated by reference herein for this purpose. This resonator applies surface acoustic waves to generate resonance and can be fabricated on a substrate without the necessity of being released. Applicants' exemplary embodiments differ in several respects, however. First, the SAW resonator applies surface resonance by generating a surface acoustic wave with Interdigited Fingers (IDT) and localizing it between surface wave reflectors on both sides. The SAW design still requires a released surface for the surface acoustic wave to exist, and therefore cannot be fully encompassed in solid medium to achieve circuit integration or minimum packaging solutions. Second, the SAW resonator requires a surface acoustic wave on a piezoelectric material to operate. This material, as well as a general fabrication process, is not CMOS compatible. As a result, the SAW design cannot be fabricated with a circuit side by side in the same substrate. Consequently, to integrate the SAW device with other circuits, it must be wire-bonded, which can induce parasitics and require complex and power-consuming matching circuits to compensate. Exemplary embodiments of the present disclosure do not have this requirement. Further, the disclosed resonators with ABRs can also be realized in piezoelectric materials, but are not restricted to them. Third, due to the working principles of surface waves, and the implementation of metal material to excite resonance, the working frequency of the SAW resonator is limited to around 1 GHz. On the other hand, exemplary embodiments of the present disclosure can operate at mm-wave frequencies due to the longitudinal mode and FEOL design, thereby achieving a small footprint and operating at frequencies that are not reachable by existing acoustic resonators.

Figure 23:
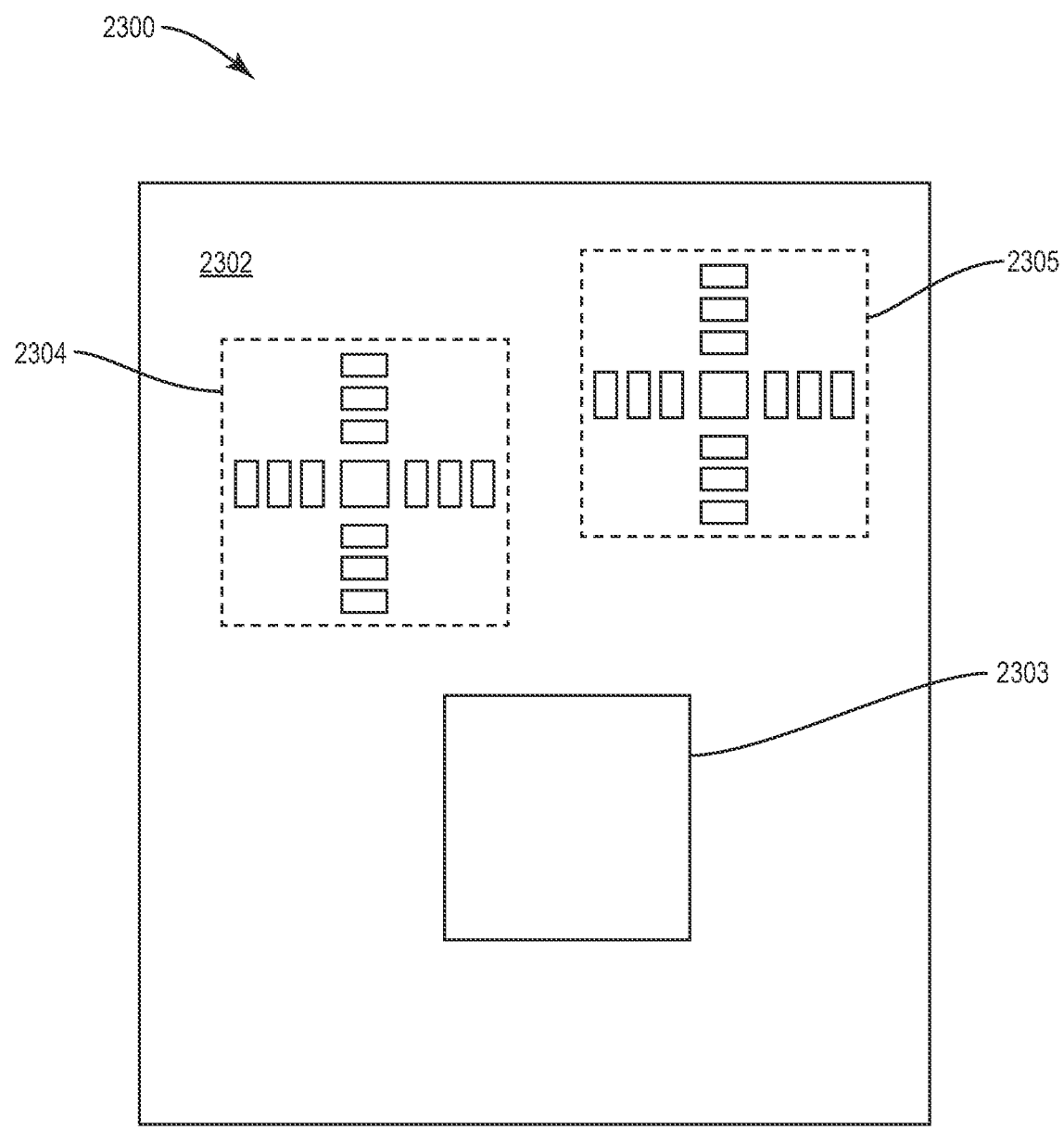
FIG. 23 illustrates a semiconductor device having a plurality of unreleased MEMS resonators and a CMOS circuit contained in a same layer of solid material.

FIG. 23 illustrates a semiconductor device 2300 having a plurality of unreleased MEMS resonators 2304, 2305 and a CMOS circuit 2303 contained in a same layer 2302 of solid material. As discussed above, the MEMS resonators 2304, 2305 can be designed to resonate at different frequencies even though they are formed in the same solid material layer 2302. Likewise, the CMOS circuit 2303 and other structures can be formed in the same solid material layer 2302 as the unreleased MEMS resonators 2304, 2305 without interfering with each other. Therefore, the CMOS compatibility nature of unreleased resonators with ABR also results in a wide range of applications. Applications requiring low phase noise oscillators or narrow bandwidth filters can take advantage of the exemplary embodiments in a monolithically integrated solution. For example, RF and mm-wave communication, navigation, and high speed digital systems are all areas that depend upon the performance of filters and oscillators and that may benefit from the presence of the disclosed unreleased design being located in a common layer. The disclosed CMOS compatible unreleased resonators with ABR can provide basic building blocks for these and other circuits with high Q, a small footprint, low power, and/or high reliability. Thus, the direct integration of MEMS into FEOL of CMOS has an impact on the fundamental principles of MEMS, as well as on the potential revolution of the RF circuit design.

As discussed above, embodiments of the present disclosure relate to a complete integration of the resonator and the disclosed energy localization method to enhance device performance. The design of the unreleased resonators disclosed herein is not limited to CMOS processes, and can be implemented in other applications where a minimal or no-packaging solution is desired. Furthermore, the resonators discussed in this disclosure are not limited to the RBT or other devices described, and can encompass any bulk MEMS resonator. Moreover, the energy localization method is not limited to 1D or 2D ABR, and can be any energy isolation method using constructive reflection of acoustic waves, including three dimensional (3D) ABR or solid phononic crystal structures.

The concept of energy localization as applied to the present disclosure is relevant to a number of other applications, and is considered within the scope of the present disclosure. For example, acoustic energy transmission properties of ABR at even multiples of a first harmonic frequency may be used to design weak-coupled unreleased resonators for multi-pole filters, or strong-coupled unreleased resonators to ensure synchrony between adjacent resonators. In one example, strong-coupled unreleased resonators can be used to build larger arrays of resonators for improved signal strength, power handling, and can reduce effects of fabrication variations, as described in "Mechanical coupling of 2D resonator arrays for MEMS filter applications," D. Weinstein, S. A. Bhave, M. Tada, S. Mitarai, S. Morita and K. Ikeda, IEEE Frequency Control Symposium (FCS 2007), which is incorporated by reference herein for this purpose. In another example, acoustic energy localization methods may be used to design acoustic wave guides. Exemplary embodiments may also be used not only to localize acoustic energy at one position, but to localize acoustic energy reflected between two foci as in the case of an ellipse. By using one focus for driving and the other for sensing, a high efficiency unreleased resonator can be designed.

Those skilled in the art will recognize improvements and modifications to the present disclosure. All such improvements and modifications are considered within the scope of the concepts disclosed herein.

What is claimed is:

1. A microelectromechanical (MEM) resonator comprising:
   a resonant cavity disposed in a first layer of a first solid material disposed on a substrate; and
   a first plurality of reflectors disposed in the first layer in a first direction with respect to the resonant cavity and to each other; wherein:
   each of the first plurality of reflectors comprises an outer layer of a second solid material and an inner layer of a third solid material; and
   the inner layer of each of the first plurality of reflectors is adjacent in the first direction to the outer layer of the reflector and to either the outer layer of an adjacent reflector or the resonant cavity.

2. The MEM resonator of claim 1, wherein the first plurality of reflectors are Acoustic Bragg Reflectors.

3. The MEM resonator of claim 1, wherein the first solid material and the third solid material are the same material.

4. The MEM resonator of claim 1, further comprising a second plurality of reflectors disposed in the first layer in a second direction with respect to the resonant cavity and to each other, the second direction being normal to the first direction; wherein:
   each of the second plurality of reflectors comprises an outer layer of the second solid material and an inner layer of the third solid material; and
   the inner layer of each of the second plurality of reflectors is adjacent in the second direction to the outer layer of the reflector and to either the outer layer of an adjacent reflector or the resonant cavity.

5. The MEM resonator of claim 4, wherein the resonant cavity is disposed in a rectangular area of a plane defined by the first and second directions, the rectangular area having a length defined by a distance between outer surfaces of the two outermost reflectors in the first direction, and having a width defined by a distance between outer surfaces of the two outermost reflectors in the second direction, wherein the rectangular area of the plane does not contain any reflectors apart from the first and second plurality of reflectors.

6. The MEM resonator of claim 5, wherein each of the second plurality of reflectors has a width substantially equal to a first dimension of the resonant cavity in the first direction, and each of the first plurality of reflectors has a width substantially equal to a second dimension of the resonant cavity in the second direction.

7. The MEM resonator of claim 4, wherein:
the MEM resonator is configured to amplify acoustic waves having a predetermined wavelength $\lambda$;
each of the inner layers of the first plurality of reflectors has a thickness equal to an odd multiple of $\lambda/4$;
each of the outer layers of the first plurality of reflectors has a thickness equal to an odd multiple of $\lambda/4$;
each of the inner layers of the second plurality of reflectors has a thickness equal to an odd multiple of $\lambda/4$; and
each of the outer layers of the second plurality of reflectors has a thickness equal to an odd multiple of $\lambda/4$.

8. The MEM resonator of claim 7, wherein the first plurality of reflectors comprises at least three reflectors on either side of the resonant cavity in the first direction and the second plurality of reflectors comprises at least three reflectors on either side of the resonant cavity in the second direction.

9. The MEM resonator of claim 7, wherein the first plurality of reflectors comprises at least seven reflectors on either side of the resonant cavity in the first direction and the second plurality of reflectors comprises at least seven reflectors on either side of the resonant cavity in the second direction.

10. The MEM resonator of claim 1, wherein:
the MEM resonator is configured to amplify acoustic waves having a predetermined wavelength $\lambda$;
each of the inner layers of the first plurality of reflectors has a thickness equal to an odd multiple of $\lambda/4$; and
each of the outer layers of the first plurality of reflectors has a thickness equal to an odd multiple of $\lambda/4$.

11. The MEM resonator of claim 10, wherein the first plurality of reflectors comprises at least three reflectors on both sides of the resonant cavity in the first direction.

12. The MEM resonator of claim 11, wherein the first plurality of reflectors comprises at least seven reflectors on both sides of the resonant cavity in the first direction.

13. The MEM resonator of claim 1, wherein the second solid material is silicon, and the third solid material an oxide.

14. The MEM resonator of claim 13, wherein the third solid material is composed of silicon dioxide.

15. The MEM resonator of claim 14, wherein the first solid material is composed of silicon dioxide.

16. The MEM resonator of claim 1, wherein the first layer surrounds and encloses the resonant cavity.

17. The MEM resonator of claim 16, wherein the first layer surrounds and encloses each of the first plurality of reflectors.

18. A method of forming a microelectromechanical (MEM) resonator comprising:
disposing a first layer of a first solid material on a substrate;
defining a resonant cavity in the first layer; and
disposing a plurality of outer layers of a second solid material in the first layer in a first direction with respect to the resonant cavity and to each other, such that each of the plurality of outer layers forms an outer layer of a respective one of a first plurality of reflectors, wherein:
each of the first plurality of reflectors comprises an inner layer of a third solid material, such that the inner layer of each of the first plurality of reflectors is adjacent to the outer layer of the reflector and to either the outer layer of an adjacent reflector or the resonant cavity.

19. The method of claim 18, wherein the first plurality of reflectors are Acoustic Bragg Reflectors.

20. The method of claim 18, wherein the first solid material and the third solid material of the inner layer are the same material and are formed simultaneously during the disposing of the first layer of solid material on the substrate.

21. The method of claim 20, wherein the disposing of the plurality of outer layers comprises etching a plurality of trenches in the first layer and depositing the plurality of outer layers in the plurality of trenches.

22. The method of claim 18, further comprising disposing a plurality of inner layers of the first solid material in the first layer in the first direction with respect to the resonant cavity, the plurality of outer layers and each other, such that each of the plurality of inner layers is an inner layer of a respective one of the first plurality of reflectors.

23. A semiconductor device comprising:
a solid material disposed on a substrate; and
a first microelectromechanical (MEM) resonator comprising:
a first plurality of reflectors disposed in a first layer in a first direction with respect to a resonant cavity and to each other; wherein:
each of the first plurality of reflectors comprises an outer layer of a second solid material and an inner layer of a third solid material; and
the inner layer of each of the first plurality of reflectors is adjacent in the first direction to the outer layer of the reflector and to either the outer layer of an adjacent reflector or the resonant cavity.

24. The semiconductor device of claim 23, further comprising:
a second microelectromechanical (MEM) resonator comprising:
a second plurality of reflectors disposed in the first layer in the first direction with respect to the resonant cavity and to each other, wherein:
each of the second plurality of reflectors comprises the outer layer of the second solid material and the inner layer of the third solid material; and
the inner layer of each of the second plurality of reflectors is adjacent in the first direction to the outer layer of the reflector and to either the outer layer of an adjacent reflector or the resonant cavity, wherein:
the first MEM resonator is configured to resonate at a first frequency; and
the second MEM resonator is configured to resonate at a second frequency that is different from the first frequency.

25. The semiconductor device of claim 24, further comprising a complementary metal-oxide semiconductor (CMOS) circuit disposed in the first layer.

26. The semiconductor device of claim 23, further comprising a complementary metal-oxide semiconductor (CMOS) circuit disposed in the first layer.

* * * * *